US012615069B2

(12) United States Patent
Zhao et al.

(10) Patent No.: US 12,615,069 B2
(45) Date of Patent: Apr. 28, 2026

(54) MULTIPLE FREQUENCY RANGE POSITIONING SIGNAL PROCESSING

(71) Applicant: QUALCOMM Incorporated, San Diego, CA (US)

(72) Inventors: Liang Zhao, Saratoga, CA (US); Hong Sun Kim, San Jose, CA (US); Angelica Wong, Palo Alto, CA (US); Jordan Cookman, San Jose, CA (US); Jean-Pierre Raffegeau, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 302 days.

(21) Appl. No.: 18/185,078

(22) Filed: Mar. 16, 2023

(65) Prior Publication Data

US 2024/0313818 A1    Sep. 19, 2024

(51) Int. Cl.
| | |
|---|---|
| *H04B 1/40* | (2015.01) |
| *H03M 1/08* | (2006.01) |
| *H04W 64/00* | (2009.01) |

(52) U.S. Cl.
CPC ............ *H04B 1/40* (2013.01); *H03M 1/0836* (2013.01); *H04W 64/003* (2013.01)

(58) Field of Classification Search
CPC ........... H04B 1/40; G01S 19/32; G01S 19/33; H03M 1/0836; H04W 64/003
USPC ........................................................ 375/355
See application file for complete search history.

(56) References Cited

U.S. PATENT DOCUMENTS

| | | | |
|---|---|---|---|
| 2006/0176215 A1* | 8/2006 | Dubash ................... | G01S 19/36 |
| | | | 342/357.64 |
| 2012/0189040 A1 | 7/2012 | Ramachandran et al. | |
| 2013/0148763 A1 | 6/2013 | Gunawardena et al. | |
| 2014/0028499 A1* | 1/2014 | Yeh ........................ | G01S 19/235 |
| | | | 342/357.73 |
| 2015/0133153 A1 | 5/2015 | Terashima | |

OTHER PUBLICATIONS

International Search Report and Written Opinion—PCT/US2024/013041—ISA/EPO—Jul. 10, 2024.
Partial International Search Report—PCT/US2024/013041—ISA/EPO—May 27, 2024.

* cited by examiner

*Primary Examiner* — Leila Malek
(74) *Attorney, Agent, or Firm* — QUALCOMM Incorporated

(57) ABSTRACT

A positioning signal processing method includes: receiving, wirelessly at an apparatus, a first positioning signal in a first frequency range; receiving, wirelessly at the apparatus, a second positioning signal in a second frequency range; converting the first positioning signal by a first analog-to-digital converter (ADC) of the apparatus to produce a first digital signal at a first sampling rate that is based on a clock signal; and converting the second positioning signal by a second ADC of the apparatus to produce a second digital signal at a second sampling rate that is based on the clock signal and that is different from, and related to, the first sampling rate.

27 Claims, 15 Drawing Sheets

1400

| Receiving, wirelessly at an apparatus, a first positioning signal in a first frequency range | 1410 |

| Receiving, wirelessly at the apparatus, a second positioning signal in a second frequency range | 1420 |

| Converting the first positioning signal by a first ADC of the apparatus to produce a first digital signal at a first sampling rate that is based on a clock signal | 1430 |

| Converting the second positioning signal by a second ADC of the apparatus to produce a second digital signal at a second sampling rate that is based on the clock signal and that is different from, and related to, the first sampling rate | 1440 |

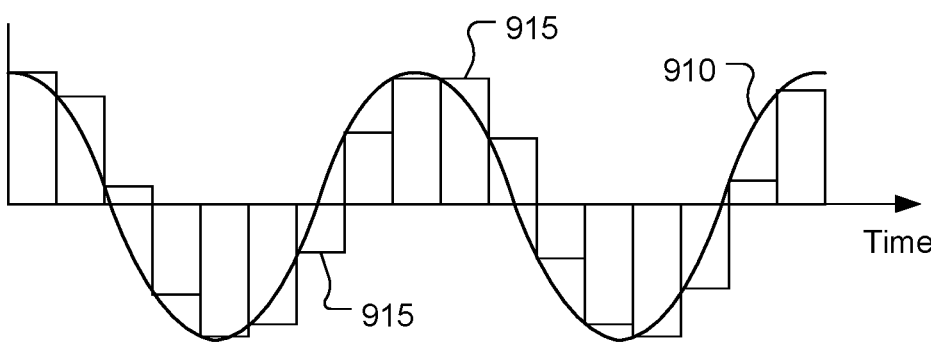
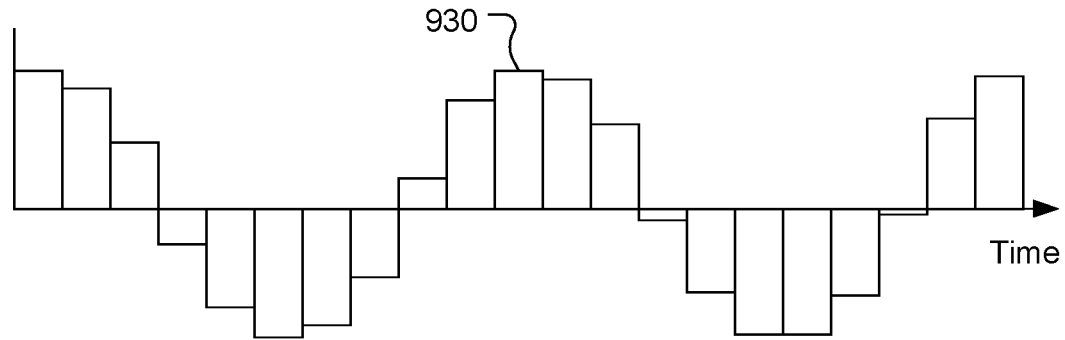
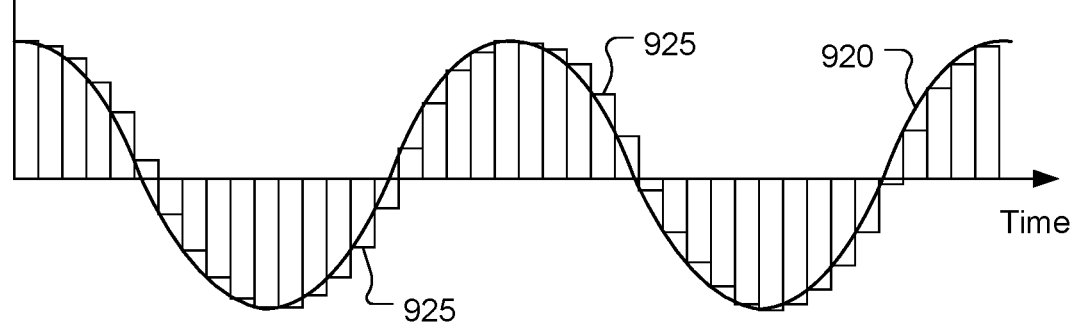
FIG. 9

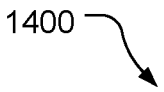

1400

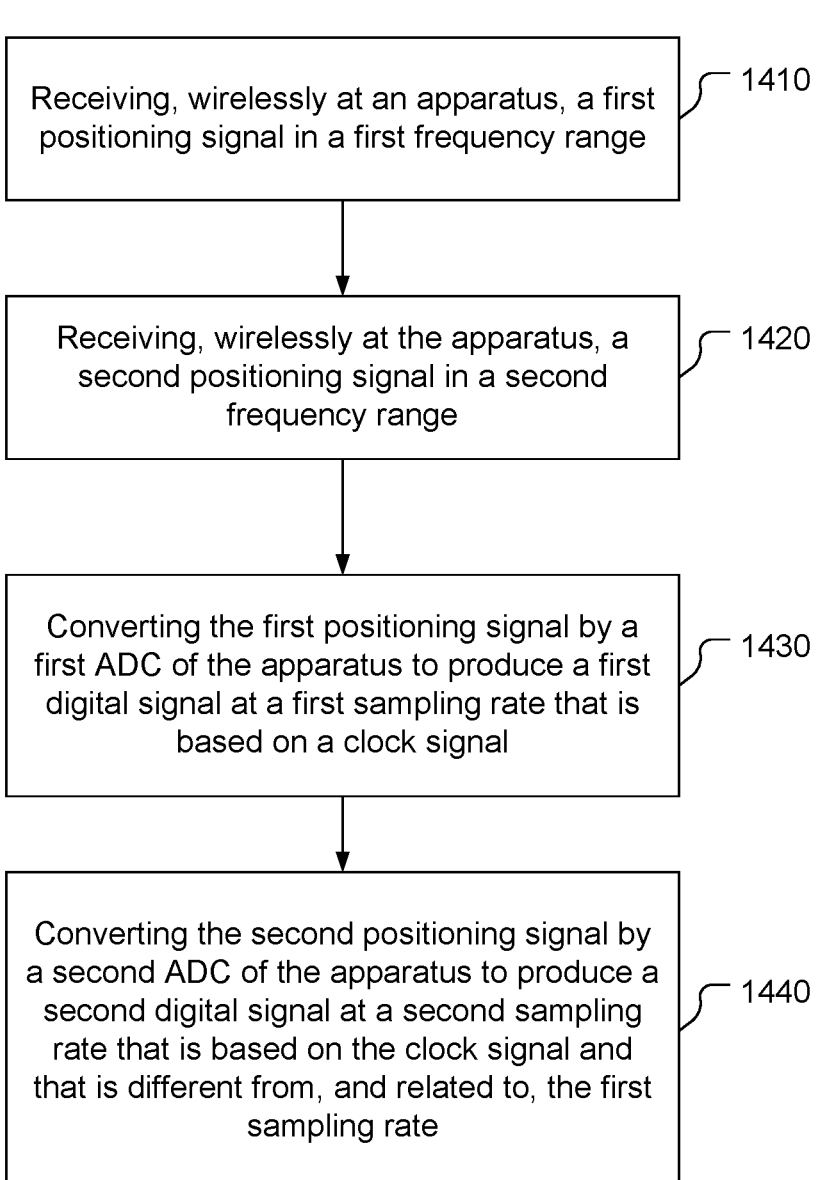

Receiving, wirelessly at an apparatus, a first positioning signal in a first frequency range — 1410

Receiving, wirelessly at the apparatus, a second positioning signal in a second frequency range — 1420

Converting the first positioning signal by a first ADC of the apparatus to produce a first digital signal at a first sampling rate that is based on a clock signal — 1430

Converting the second positioning signal by a second ADC of the apparatus to produce a second digital signal at a second sampling rate that is based on the clock signal and that is different from, and related to, the first sampling rate — 1440

FIG. 14

Clock

1/3 Clock

1/5 Clock

MULTIPLE FREQUENCY RANGE POSITIONING SIGNAL PROCESSING

BACKGROUND

Wireless communication systems have developed through various generations, including a first-generation analog wireless phone service (1G), a second-generation (2G) digital wireless phone service (including interim 2.5G and 2.75G networks), a third-generation (3G) high speed data, Internet-capable wireless service, a fourth-generation (4G) service (e.g., Long Term Evolution (LTE) or WiMax®), a fifth-generation (5G) service, etc. There are presently many different types of wireless communication systems in use, including Cellular and Personal Communications Service (PCS) systems. Examples of known cellular systems include the cellular Analog Advanced Mobile Phone System (AMPS), and digital cellular systems based on Code Division Multiple Access (CDMA), Frequency Division Multiple Access (FDMA), Orthogonal Frequency Division Multiple Access (OFDMA), Time Division Multiple Access (TDMA), the Global System for Mobile access (GSM) variation of TDMA, etc.

A fifth generation (5G) mobile standard calls for higher data transfer speeds, greater numbers of connections, and better coverage, among other improvements. The 5G standard, according to the Next Generation Mobile Networks Alliance, is designed to provide data rates of several tens of megabits per second to each of tens of thousands of users, with 1 gigabit per second to tens of workers on an office floor. Several hundreds of thousands of simultaneous connections should be supported in order to support large sensor deployments. Consequently, the spectral efficiency of 5G mobile communications should be significantly enhanced compared to the current 4G standard. Furthermore, signaling efficiencies should be enhanced and latency should be substantially reduced compared to current standards.

Positions of devices, such as mobile devices, may be determined using terrestrial-based positioning signals and/or non-terrestrial network (NTN) signals such as satellite positioning signals and/or positioning signals from aerial vehicles, etc. Satellite positioning system receivers may be included in various devices for receiving and measuring satellite positioning signals. Measurements of the satellite positioning signals may be processed to determine position information, such as ranges between satellites and the receiver and/or a position estimate for the receiver.

SUMMARY

An example apparatus includes: a receiver configured to obtain, wirelessly, a first positioning signal in a first frequency range, and configured to obtain, wirelessly, a second positioning signal in a second frequency range; a clock configured to provide a clock signal; a first receive chain, communicatively coupled to the clock and to the receiver, comprising a first analog-to-digital converter (ADC) and configured to cause the first ADC to produce a first digital signal, based on the first positioning signal, at a first sampling rate that is based on the clock signal; and a second receive chain, communicatively coupled to the clock and to the receiver, comprising a second ADC and configured to cause the second ADC to produce a second digital signal, based on the second positioning signal, at a second sampling rate that is based on the clock signal and that is different from, and related to, the first sampling rate.

An example positioning signal processing method includes: receiving, wirelessly at an apparatus, a first positioning signal in a first frequency range; receiving, wirelessly at the apparatus, a second positioning signal in a second frequency range; converting the first positioning signal by a first analog-to-digital converter (ADC) of the apparatus to produce a first digital signal at a first sampling rate that is based on a clock signal; and converting the second positioning signal by a second ADC of the apparatus to produce a second digital signal at a second sampling rate that is based on the clock signal and that is different from, and related to, the first sampling rate.

Another example apparatus includes: means for receiving, wirelessly, a first positioning signal in a first frequency range; means for receiving, wirelessly, a second positioning signal in a second frequency range; means for converting the first positioning signal by a first analog-to-digital converter (ADC) of the apparatus to produce a first digital signal at a first sampling rate that is based on a clock signal; and means for converting the second positioning signal by a second ADC of the apparatus to produce a second digital signal at a second sampling rate that is based on the clock signal and that is different from, and related to, the first sampling rate.

BRIEF DESCRIPTION OF THE DRAWINGS

FIG. 9 is a timing diagram of sampled signals in the positioning signal receiver shown in FIG. 8.

FIG. 14 is a block diagram of a positioning signal processing method.

DETAILED DESCRIPTION

Figure 1:
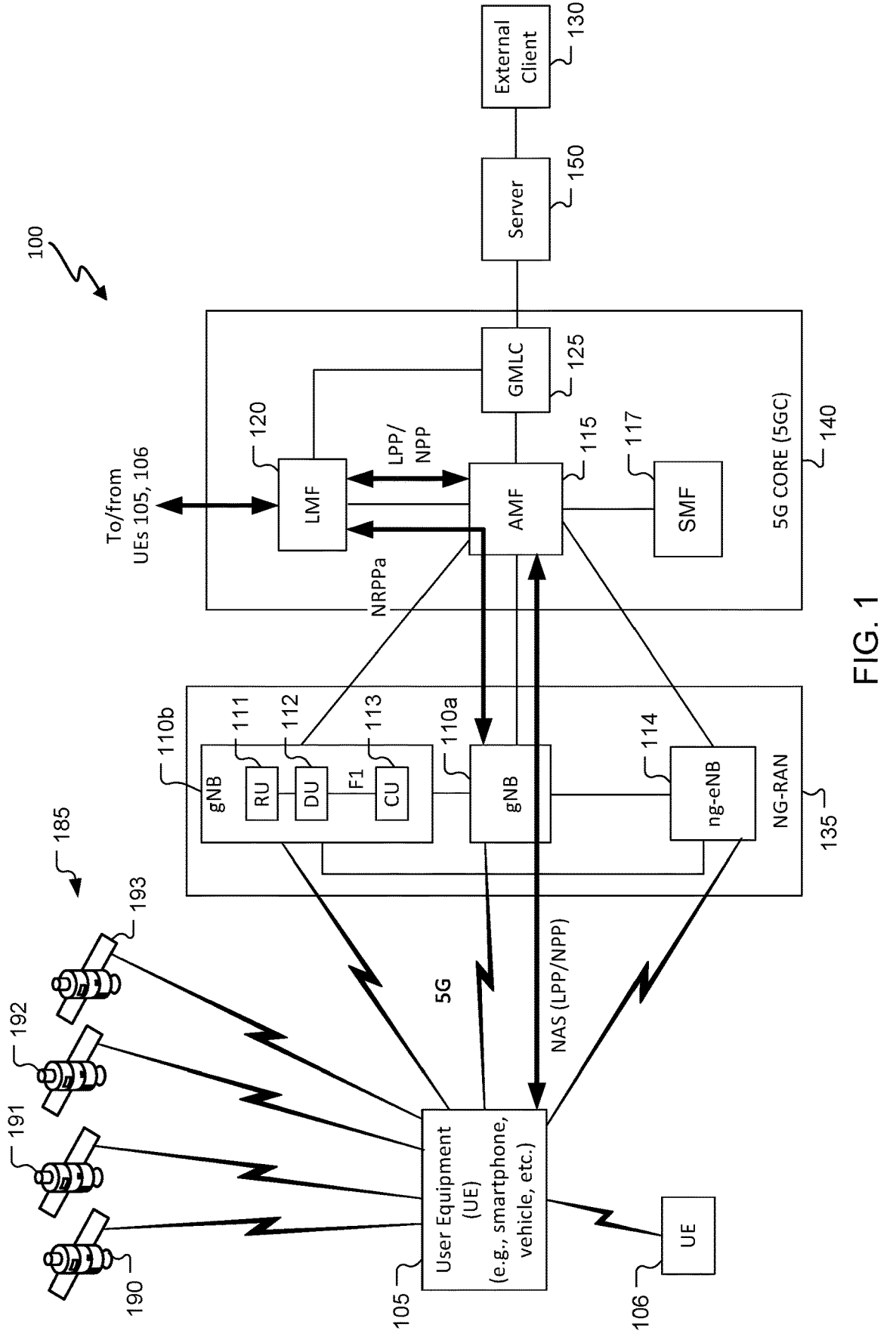
FIG. 1 is a simplified diagram of an example wireless communications system.

Techniques are discussed herein for processing signals over different frequency ranges. For example, a positioning signal receiver of a mobile device may have multiple receive chains for receiving and processing positioning signals corresponding to multiple different frequency ranges. Analog-to-digital converters (ADCs) in the receive chains may be operated at different sampling rates, to convert positioning signals from analog signals to digital signals, while being phase synchronized. One or more of the sampling rates of the digital signals may be adjusted so that the sampling rates of the digital signals of the different receive chains are the same, with a fixed phase relationship between the digital signals in the different receive chains. These are examples, and other examples may be implemented.

Items and/or techniques described herein may provide one or more of the following capabilities, as well as other capabilities not mentioned. Positioning accuracy may be improved by processing signals over a wider frequency range. Positioning accuracy may be improved by processing signals over multiple, different frequency ranges, while providing synchronization between the ADC sampling clock signal for different receive chains for the different frequency ranges of positioning signals. Different frequency ranges of positioning signals may be processed while leveraging a portion of a legacy navigation receiver design and legacy components. Other capabilities may be provided and not every implementation according to the disclosure must provide any, let alone all, of the capabilities discussed.

Obtaining the locations of mobile devices that are accessing a wireless network may be useful for many applications including, for example, emergency calls, personal navigation, consumer asset tracking, locating a friend or family member, etc. Existing positioning methods include methods based on measuring radio signals transmitted from a variety of devices or entities including satellite vehicles (SVs) and terrestrial radio sources in a wireless network such as base stations and access points. It is expected that standardization for the 5G wireless networks will include support for various positioning methods, which may utilize reference signals transmitted by base stations in a manner similar to which LTE wireless networks currently utilize Positioning Reference Signals (PRS) and/or Cell-specific Reference Signals (CRS) for position determination.

The description herein may refer to sequences of actions to be performed, for example, by elements of a computing device. Various actions described herein can be performed by specific circuits (e.g., an application specific integrated circuit (ASIC)), by program instructions being executed by one or more processors, or by a combination of both. Sequences of actions described herein may be embodied within a non-transitory computer-readable medium having stored thereon a corresponding set of computer instructions that upon execution would cause an associated processor to perform the functionality described herein. Thus, the various examples described herein may be embodied in a number of different forms, all of which are within the scope of the disclosure, including claimed subject matter.

As used herein, the terms "user equipment" (UE) and "base station" are not specific to or otherwise limited to any particular Radio Access Technology (RAT), unless otherwise noted. In general, such UEs may be any wireless communication device (e.g., a mobile phone, router, tablet computer, laptop computer, consumer asset tracking device, Internet of Things (IoT) device, etc.) used by a user to communicate over a wireless communications network. A UE may be mobile or may (e.g., at certain times) be stationary, and may communicate with a Radio Access Network (RAN). As used herein, the term "UE" may be referred to interchangeably as an "access terminal" or "AT," a "client device," a "wireless device," a "subscriber device," a "subscriber terminal," a "subscriber station," a "user terminal" or UT, a "mobile terminal," a "mobile station," a "mobile device," or variations thereof. Generally, UEs can communicate with a core network via a RAN, and through the core network the UEs can be connected with external networks such as the Internet and with other UEs. Of course, other mechanisms of connecting to the core network and/or the Internet are also possible for the UEs, such as over wired access networks, WiFi® networks (e.g., based on IEEE (Institute of Electrical and Electronics Engineers) 802.11, etc.) and so on.

A base station may operate according to one of several RATs in communication with UEs depending on the network in which it is deployed. Examples of a base station include an Access Point (AP), a Network Node, a NodeB, an evolved NodeB (eNB), or a general Node B (gNodeB, gNB). In addition, in some systems a base station may provide purely edge node signaling functions while in other systems it may provide additional control and/or network management functions.

UEs may be embodied by any of a number of types of devices including but not limited to printed circuit (PC) cards, compact flash devices, external or internal modems, wireless or wireline phones, smartphones, tablets, consumer asset tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

As used herein, the term "cell" or "sector" may correspond to one of a plurality of cells of a base station, or to the base station itself, depending on the context. The term "cell" may refer to a logical communication entity used for communication with a base station (for example, over a carrier), and may be associated with an identifier for distinguishing neighboring cells (for example, a physical cell identifier (PCID), a virtual cell identifier (VCID)) operating via the same or a different carrier. In some examples, a carrier may support multiple cells, and different cells may be configured according to different protocol types (for example, machine-type communication (MTC), narrowband Internet-of-Things (NB-IoT), enhanced mobile broadband (eMBB), or others) that may provide access for different types of devices. In some examples, the term "cell" may refer to a portion of a geographic coverage area (for example, a sector) over which the logical entity operates.

Referring to FIG. 1, an example of a communication system 100 includes a UE 105, a UE 106, a Radio Access Network (RAN), here a Fifth Generation (5G) Next Generation (NG) RAN (NG-RAN) 135, a 5G Core Network (5GC) 140, and a server 150. The UE 105 and/or the UE 106 may be, e.g., an IoT device, a location tracker device, a cellular telephone, a vehicle (e.g., a car, a truck, a bus, a boat, etc.), or other device. A 5G network may also be referred to as a New Radio (NR) network; NG-RAN 135 may be referred to as a 5G RAN or as an NR RAN; and 5GC 140 may be referred to as an NG Core network (NGC). Standardization of an NG-RAN and 5GC is ongoing in the 3rd Generation Partnership Project (3GPP). Accordingly, the NG-RAN 135 and the 5GC 140 may conform to current or future standards for 5G support from 3GPP. The NG-RAN 135 may be another type of RAN, e.g., a 3G RAN, a 4G Long Term Evolution (LTE) RAN, etc. The UE 106 may be configured and coupled similarly to the UE 105 to send and/or receive signals to/from similar other entities in the system 100, but such signaling is not indicated in FIG. 1 for the sake of simplicity of the figure. Similarly, the discussion focuses on the UE 105 for the sake of simplicity. The communication system 100 may utilize information from a constellation 185 of satellite vehicles (SVs) 190, 191, 192, 193 for a Satellite Positioning System (SPS) (e.g., a Global Navigation Satellite System (GNSS)) like the Global Positioning System (GPS), the Global Navigation Satellite System (GLONASS), Galileo, or Beidou or some other local or regional SPS such as the Indian Regional Navigational Satellite System (IRNSS), the European Geostationary Navigation Overlay Service (EGNOS), the Quasi-Zenith Satellite System (QZSS, also called Michibiki), or the Wide Area Augmentation System (WAAS). Additional components of the communication system 100 are described below. The communication system 100 may include additional or alternative components.

As shown in FIG. 1, the NG-RAN 135 includes NR nodeBs (gNBs) 110*a*, 110*b*, and a next generation eNodeB (ng-NB) 114, and the 5GC 140 includes an Access and Mobility Management Function (AMF) 115, a Session Management Function (SMF) 117, a Location Management Function (LMF) 120, and a Gateway Mobile Location Center (GMLC) 125. The gNBs 110*a*. 110*b* and the ng-eNB 114 are communicatively coupled to each other, are each configured to bi-directionally wirelessly communicate with the UE 105, and are each communicatively coupled to, and configured to bi-directionally communicate with, the AMF 115. The gNBs 110*a*, 110*b*, and the ng-eNB 114 may be referred to as base stations (BSs). The AMF 115, the SMF 117, the LMF 120, and the GMLC 125 are communicatively coupled to each other, and the GMLC is communicatively coupled to an external client 130. The SMF 117 may serve as an initial contact point of a Service Control Function (SCF) (not shown) to create, control, and delete media sessions. Base stations such as the gNBs 110*a*, 110*b* and/or the ng-eNB 114 may be a macro cell (e.g., a high-power cellular base station), or a small cell (e.g., a low-power cellular base station), or an access point (e.g., a short-range base station configured to communicate with short-range technology such as WiFi®, WiFi®-Direct (WiFi®-D), Bluetooth®, Bluetooth®-low energy (BLE), Zigbee®, etc. One or more base stations, e.g., one or more of the gNBs 110*a*, 110*b* and/or the ng-eNB 114 may be configured to communicate with the UE 105 via multiple carriers. Each of the gNBs 110*a*, 110*b* and/or the ng-eNB 114 may provide communication coverage for a respective geographic region, e.g. a cell. Each cell may be partitioned into multiple sectors as a function of the base station antennas.

FIG. 1 provides a generalized illustration of various components, any or all of which may be utilized as appropriate, and each of which may be duplicated or omitted as necessary. Specifically, although one UE 105 is illustrated, many UEs (e.g., hundreds, thousands, millions, etc.) may be utilized in the communication system 100. Similarly, the communication system 100 may include a larger (or smaller) number of SVs (i.e., more or fewer than the four SVs 190-193 shown), gNBs 110*a*, 110*b*, ng-eNBs 114, AMFs 115, external clients 130, and/or other components. The illustrated connections that connect the various components in the communication system 100 include data and signaling connections which may include additional (intermediary) components, direct or indirect physical and/or wireless connections, and/or additional networks. Furthermore, components may be rearranged, combined, separated, substituted, and/or omitted, depending on desired functionality.

While FIG. 1 illustrates a 5G-based network, similar network implementations and configurations may be used for other communication technologies, such as 3G, Long Term Evolution (LTE), etc. Implementations described herein (be they for 5G technology and/or for one or more other communication technologies and/or protocols) may be used to transmit (or broadcast) directional synchronization signals, receive and measure directional signals at UEs (e.g., the UE 105) and/or provide location assistance to the UE 105 (via the GMLC 125 or other location server) and/or compute a location for the UE 105 at a location-capable device such as the UE 105, the gNB 110*a*, 110*b*, or the LMF 120 based on measurement quantities received at the UE 105 for such directionally-transmitted signals. The gateway mobile location center (GMLC) 125, the location management function (LMF) 120, the access and mobility management function (AMF) 115, the SMF 117, the ng-cNB (eNodeB) 114 and the gNBs (gNodeBs) 110*a*, 110*b* are examples and may, in various embodiments, be replaced by or include various other location server functionality and/or base station functionality respectively.

The system 100 is capable of wireless communication in that components of the system 100 can communicate with one another (at least some times using wireless connections) directly or indirectly, e.g., via the gNBs 110*a*, 110*b*, the ng-cNB 114, and/or the 5GC 140 (and/or one or more other devices not shown, such as one or more other base transceiver stations). For indirect communications, the communications may be altered during transmission from one entity to another, e.g., to alter header information of data packets, to change format, etc. The UE 105 may include multiple UEs and may be a mobile wireless communication device, but may communicate wirelessly and via wired connections. The UE 105 may be any of a variety of devices, e.g., a smartphone, a tablet computer, a vehicle-based device, etc., but these are examples as the UE 105 is not required to be any of these configurations, and other configurations of UEs may be used. Other UEs may include wearable devices (e.g., smart watches, smart jewelry, smart glasses or headsets, etc.). Still other UEs may be used, whether currently existing or developed in the future. Further, other wireless devices (whether mobile or not) may be implemented within the system 100 and may communicate with each other and/or with the UE 105, the gNBs 110*a*. 110*b*, the ng-eNB 114, the 5GC 140, and/or the external client 130. For example, such other devices may include internet of thing (IoT) devices, medical devices, home entertainment and/or automation devices, etc. The 5GC 140 may communicate with the external client 130 (e.g., a computer system), e.g., to allow the external client 130 to request and/or receive location information regarding the UE 105 (e.g., via the GMLC 125).

The UE 105 or other devices may be configured to communicate in various networks and/or for various purposes and/or using various technologies (e.g., 5G, Wi-Fi® communication, multiple frequencies of Wi-Fi® communication, satellite positioning, one or more types of communications (e.g., GSM (Global System for Mobiles), CDMA (Code Division Multiple Access), LTE (Long Term Evolution), V2X (Vehicle-to-Everything, e.g., V2P (Vehicle-to-Pedestrian), V2I (Vehicle-to-Infrastructure), V2V (Vehicle-to-Vehicle), etc.), IEEE 802.11p, etc.). V2X communications may be cellular (Cellular-V2X (C-V2X)) and/or WiFi® (e.g., DSRC (Dedicated Short-Range Connection)). The system 100 may support operation on multiple carriers (waveform signals of different frequencies). Multi-carrier transmitters can transmit modulated signals simultaneously on the multiple carriers. Each modulated signal may be a Code Division Multiple Access (CDMA) signal, a Time Division Multiple Access (TDMA) signal, an Orthogonal Frequency Division Multiple Access (OFDMA) signal, a Single-Carrier Frequency Division Multiple Access (SC-FDMA) signal, etc. Each modulated signal may be sent on a different carrier and may carry pilot, overhead information, data, etc. The UEs 105, 106 may communicate with each other through UE-to-UE sidelink ($S_L$) communications by transmitting over one or more sidelink channels such as a physical sidelink synchronization channel (PSSCH), a physical sidelink broadcast channel (PSBCH), or a physical sidelink control channel (PSCCH). Direct device-to-device communications (without going through a network) may be referred to generally as sidelink communications without limiting the communications to a particular protocol.

The UE 105 may comprise and/or may be referred to as a device, a mobile device, a wireless device, a mobile terminal, a terminal, a mobile station (MS), a Secure User Plane Location (SUP$_L$) Enabled Terminal (SET), or by some other name. Moreover, the UE 105 may correspond to a cellphone, smartphone, laptop, tablet, PDA, consumer asset tracking device, navigation device, Internet of Things (IoT) device, health monitors, security systems, smart city sensors, smart meters, wearable trackers, or some other portable or moveable device. Typically, though not necessarily, the UE 105 may support wireless communication using one or more Radio Access Technologies (RATs) such as Global System for Mobile communication (GSM), Code Division Multiple Access (CDMA), Wideband CDMA (WCDMA), LTE, High Rate Packet Data (HRPD), IEEE 802.11 WiFi® (also referred to as Wi-Fi®), Bluetooth® (BT), Worldwide Interoperability for Microwave Access (WiMax®), 5G new radio (NR) (e.g., using the NG-RAN 135 and the 5GC 140), etc. The UE 105 may support wireless communication using a Wireless Local Area Network (WLAN) which may connect to other networks (e.g., the Internet) using a Digital Subscriber Line (DS$_L$) or packet cable, for example. The use of one or more of these RATs may allow the UE 105 to communicate with the external client 130 (e.g., via elements of the 5GC 140 not shown in FIG. 1, or possibly via the GMLC 125) and/or allow the external client 130 to receive location information regarding the UE 105 (e.g., via the GMLC 125).

The UE 105 may include a single entity or may include multiple entities such as in a personal area network where a user may employ audio, video and/or data I/O (input/output) devices and/or body sensors and a separate wireline or wireless modem. An estimate of a location of the UE 105 may be referred to as a location, location estimate, location fix, fix, position, position estimate, or position fix, and may be geographic, thus providing location coordinates for the UE 105 (e.g., latitude and longitude) which may or may not include an altitude component (e.g., height above sea level, height above or depth below ground level, floor level, or basement level). Alternatively, a location of the UE 105 may be expressed as a civic location (e.g., as a postal address or the designation of some point or small area in a building such as a particular room or floor). A location of the UE 105 may be expressed as an area or volume (defined either geographically or in civic form) within which the UE 105 is expected to be located with some probability or confidence level (e.g., 67%, 95%, etc.). A location of the UE 105 may be expressed as a relative location comprising, for example, a distance and direction from a known location. The relative location may be expressed as relative coordinates (e.g., X, Y (and Z) coordinates) defined relative to some origin at a known location which may be defined, e.g., geographically, in civic terms, or by reference to a point, area, or volume, e.g., indicated on a map, floor plan, or building plan. In the description contained herein, the use of the term location may comprise any of these variants unless indicated otherwise. When computing the location of a UE, it is common to solve for local x, y, and possibly z coordinates and then, if desired, convert the local coordinates into absolute coordinates (e.g., for latitude, longitude, and altitude above or below mean sea level).

The UE 105 may be configured to communicate with other entities using one or more of a variety of technologies. The UE 105 may be configured to connect indirectly to one or more communication networks via one or more device-to-device (D2D) peer-to-peer (P2P) links. The D2D P2P links may be supported with any appropriate D2D radio access technology (RAT), such as LTE Direct (LTE-D), WiFi® Direct (WiFi®-D), Bluetooth®, and so on. One or more of a group of UEs utilizing D2D communications may be within a geographic coverage area of a Transmission/Reception Point (TRP) such as one or more of the gNBs 110a, 110b, and/or the ng-eNB 114. Other UEs in such a group may be outside such geographic coverage areas, or may be otherwise unable to receive transmissions from a base station. Groups of UEs communicating via D2D communications may utilize a one-to-many (1:M) system in which each UE may transmit to other UEs in the group. A TRP may facilitate scheduling of resources for D2D communications. In other cases, D2D communications may be carried out between UEs without the involvement of a TRP. One or more of a group of UEs utilizing D2D communications may be within a geographic coverage area of a TRP. Other UEs in such a group may be outside such geographic coverage areas, or be otherwise unable to receive transmissions from a base station. Groups of UEs communicating via D2D communications may utilize a one-to-many (1:M) system in which each UE may transmit to other UEs in the group. A TRP may facilitate scheduling of resources for D2D communications. In other cases, D2D communications may be carried out between UEs without the involvement of a TRP.

Base stations (BSs) in the NG-RAN 135 shown in FIG. 1 include NR Node Bs, referred to as the gNBs 110a and 110b. Pairs of the gNBs 110a, 110b in the NG-RAN 135 may be connected to one another via one or more other gNBs. Access to the 5G network is provided to the UE 105 via wireless communication between the UE 105 and one or more of the gNBs 110a, 110b, which may provide wireless communications access to the 5GC 140 on behalf of the UE 105 using 5G. In FIG. 1, the serving gNB for the UE 105 is assumed to be the gNB 110a, although another gNB (e.g., the gNB 110b) may act as a serving gNB if the UE 105 moves to another location or may act as a secondary gNB to provide additional throughput and bandwidth to the UE 105.

Base stations (BSs) in the NG-RAN 135 shown in FIG. 1 may include the ng-eNB 114, also referred to as a next generation evolved Node B. The ng-eNB 114 may be connected to one or more of the gNBs 110a, 110b in the NG-RAN 135, possibly via one or more other gNBs and/or one or more other ng-eNBs. The ng-eNB 114 may provide LTE wireless access and/or evolved LTE (ELTE) wireless access to the UE 105. One or more of the gNBs 110a, 110b and/or the ng-eNB 114 may be configured to function as positioning-only beacons which may transmit signals to assist with determining the position of the UE 105 but may not receive signals from the UE 105 or from other UEs.

The gNBs 110a, 110b and/or the ng-eNB 114 may each comprise one or more TRPs. For example, each sector within a cell of a BS may comprise a TRP, although multiple TRPs may share one or more components (e.g., share a processor but have separate antennas). The system 100 may include macro TRPs exclusively or the system 100 may have TRPs of different types, e.g., macro, pico, and/or femto TRPs, etc. A macro TRP may cover a relatively large geographic area (e.g., several kilometers in radius) and may allow unrestricted access by terminals with service subscription. A pico TRP may cover a relatively small geographic area (e.g., a pico cell) and may allow unrestricted access by terminals with service subscription. A femto or home TRP may cover a relatively small geographic area (e.g., a femto cell) and may allow restricted access by terminals having association with the femto cell (e.g., terminals for users in a home).

Each of the gNBs 110*a*, 110*b* and/or the ng-eNB 114 may include a radio unit (RU), a distributed unit (DU), and a central unit (CU). For example, the gNB 110*b* includes an RU 111, a DU 112, and a CU 113. The RU 111, DU 112, and CU 113 divide functionality of the gNB 110*b*. While the gNB 110*b* is shown with a single RU, a single DU, and a single CU, a gNB may include one or more RUs, one or more DUs, and/or one or more CUs. An interface between the CU 113 and the DU 112 is referred to as an F1 interface. The RU 111 is configured to perform digital front end (DFE) functions (e.g., analog-to-digital conversion, filtering, power amplification, transmission/reception) and digital beamforming, and includes a portion of the physical (PHY) layer. The RU 111 may perform the DFE using massive multiple input/multiple output (MIMO) and may be integrated with one or more antennas of the gNB 110*b*. The DU 112 hosts the Radio Link Control (RLC), Medium Access Control (MAC), and physical layers of the gNB 110*b*. One DU can support one or more cells, and each cell is supported by a single DU. The operation of the DU 112 is controlled by the CU 113. The CU 113 is configured to perform functions for transferring user data, mobility control, radio access network sharing, positioning, session management, etc. although some functions are allocated exclusively to the DU 112. The CU 113 hosts the Radio Resource Control (RRC), Service Data Adaptation Protocol (SDAP), and Packet Data Convergence Protocol (PDCP) protocols of the gNB 110*b*. The UE 105 may communicate with the CU 113 via RRC, SDAP, and PDCP layers, with the DU 112 via the RLC, MAC, and PHY layers, and with the RU 111 via the PHY layer.

As noted, while FIG. 1 depicts nodes configured to communicate according to 5G communication protocols, nodes configured to communicate according to other communication protocols, such as, for example, an LTE protocol or IEEE 802.11x protocol, may be used. For example, in an Evolved Packet System (EPS) providing LTE wireless access to the UE 105, a RAN may comprise an Evolved Universal Mobile Telecommunications System (UMTS) Terrestrial Radio Access Network (E-UTRAN) which may comprise base stations comprising evolved Node Bs (eNBs). A core network for EPS may comprise an Evolved Packet Core (EPC). An EPS may comprise an E-UTRAN plus EPC, where the E-UTRAN corresponds to the NG-RAN 135 and the EPC corresponds to the 5GC 140 in FIG. 1.

The gNBs 110*a*, 110*b* and the ng-eNB 114 may communicate with the AMF 115, which, for positioning functionality, communicates with the LMF 120. The AMF 115 may support mobility of the UE 105, including cell change and handover and may participate in supporting a signaling connection to the UE 105 and possibly data and voice bearers for the UE 105. The LMF 120 may communicate directly with the UE 105, e.g., through wireless communications, or directly with the gNBs 110*a*, 110*b* and/or the ng-eNB 114. The LMF 120 may support positioning of the UE 105 when the UE 105 accesses the NG-RAN 135 and may support position procedures/methods such as Assisted GNSS (A-GNSS), Observed Time Difference of Arrival (OTDOA) (e.g., Downlink (DL) OTDOA or Uplink (U$_L$) OTDOA), Round Trip Time (RTT), Multi-Cell RTT, Real Time Kinematic (RT$_K$), Precise Point Positioning (PPP), Differential GNSS (DGNSS), Enhanced Cell ID (E-CID), angle of arrival (AoA), angle of departure (AoD), and/or other position methods. The LMF 120 may process location services requests for the UE 105, e.g., received from the AMF 115 or from the GMLC 125. The LMF 120 may be connected to the AMF 115 and/or to the GMLC 125. The LMF 120 may be referred to by other names such as a Location Manager (LM), Location Function (LF), commercial LMF (CLMF), or value added LMF (VLMF). A node/system that implements the LMF 120 may additionally or alternatively implement other types of location-support modules, such as an Enhanced Serving Mobile Location Center (E-SMLC) or a Secure User Plane Location (SUP$_L$) Location Platform (SLP). At least part of the positioning functionality (including derivation of the location of the UE 105) may be performed at the UE 105 (e.g., using signal measurements obtained by the UE 105 for signals transmitted by wireless nodes such as the gNBs 110*a*, 110*b* and/or the ng-eNB 114, and/or assistance data provided to the UE 105, e.g., by the LMF 120). The AMF 115 may serve as a control node that processes signaling between the UE 105 and the 5GC 140, and may provide QoS (Quality of Service) flow and session management. The AMF 115 may support mobility of the UE 105 including cell change and handover and may participate in supporting signaling connection to the UE 105.

The server 150, e.g., a cloud server, is configured to obtain and provide location estimates of the UE 105 to the external client 130. The server 150 may, for example, be configured to run a microservice/service that obtains the location estimate of the UE 105. The server 150 may, for example, pull the location estimate from (e.g., by sending a location request to) the UE 105, one or more of the gNBs 110*a*, 110*b* (e.g., via the RU 111, the DU 112, and the CU 113) and/or the ng-eNB 114, and/or the LMF 120. As another example, the UE 105, one or more of the gNBs 110*a*, 110*b* (e.g., via the RU 111, the DU 112, and the CU 113), and/or the LMF 120 may push the location estimate of the UE 105 to the server 150.

The GMLC 125 may support a location request for the UE 105 received from the external client 130 via the server 150 and may forward such a location request to the AMF 115 for forwarding by the AMF 115 to the LMF 120 or may forward the location request directly to the LMF 120. A location response from the LMF 120 (e.g., containing a location estimate for the UE 105) may be returned to the GMLC 125 either directly or via the AMF 115 and the GMLC 125 may then return the location response (e.g., containing the location estimate) to the external client 130 via the server 150. The GMLC 125 is shown connected to both the AMF 115 and LMF 120, though may not be connected to the AMF 115 or the LMF 120 in some implementations.

As further illustrated in FIG. 1, the LMF 120 may communicate with the gNBs 110*a*, 110*b* and/or the ng-eNB 114 using a New Radio Position Protocol A (which may be referred to as NPPa or NRPPa), which may be defined in 3GPP Technical Specification (TS) 38.455. NRPPa may be the same as, similar to, or an extension of the LTE Positioning Protocol A (LPPa) defined in 3GPP TS 36.455, with NRPPa messages being transferred between the gNB 110*a* (or the gNB 110*b*) and the LMF 120, and/or between the ng-eNB 114 and the LMF 120, via the AMF 115. As further illustrated in FIG. 1, the LMF 120 and the UE 105 may communicate using an LTE Positioning Protocol (LPP), which may be defined in 3GPP TS 36.355. The LMF 120 and the UE 105 may also or instead communicate using a New Radio Positioning Protocol (which may be referred to as NPP or NRPP), which may be the same as, similar to, or an extension of LPP. Here, LPP and/or NPP messages may be transferred between the UE 105 and the LMF 120 via the AMF 115 and the serving gNB 110*a*, 110*b* or the serving ng-eNB 114 for the UE 105. For example, LPP and/or NPP messages may be transferred between the LMF 120 and the AMF 115 using a 5G Location Services Application Protocol (LCS AP) and may be transferred between the AMF 115 and the UE 105 using a 5G Non-Access Stratum (NAS) protocol. The LPP and/or NPP protocol may be used to support positioning of the UE 105 using UE-assisted and/or UE-based position methods such as A-GNSS, RTK, OTDOA and/or E-CID. The NRPPa protocol may be used to support positioning of the UE 105 using network-based position methods such as E-CID (e.g., when used with measurements obtained by the gNB 110*a*, 110*b* or the ng-eNB 114) and/or may be used by the LMF 120 to obtain location related information from the gNBs 110*a*, 110*b* and/or the ng-eNB 114, such as parameters defining directional SS or PRS transmissions from the gNBs 110*a*, 110*b*, and/or the ng-eNB 114. The LMF 120 may be co-located or integrated with a gNB or a TRP, or may be disposed remote from the gNB and/or the TRP and configured to communicate directly or indirectly with the gNB and/or the TRP.

With a UE-assisted position method, the UE 105 may obtain location measurements and send the measurements to a location server (e.g., the LMF 120) for computation of a location estimate for the UE 105. For example, the location measurements may include one or more of a Received Signal Strength Indication (RSSI), Round Trip signal propagation Time (RTT), Reference Signal Time Difference (RSTD), Reference Signal Received Power (RSRP) and/or Reference Signal Received Quality (RSRQ) for the gNBs 110*a*, 110*b*, the ng-eNB 114, and/or a WLAN AP. The location measurements may also or instead include measurements of GNSS pseudorange, code phase, and/or carrier phase for the SVs 190-193.

With a UE-based position method, the UE 105 may obtain location measurements (e.g., which may be the same as or similar to location measurements for a UE-assisted position method) and may compute a location of the UE 105 (e.g., with the help of assistance data received from a location server such as the LMF 120 or broadcast by the gNBs 110*a*, 110*b*, the ng-eNB 114, or other base stations or APs).

With a network-based position method, one or more base stations (e.g., the gNBs 110*a*, 110*b*, and/or the ng-eNB 114) or APs may obtain location measurements (e.g., measurements of RSSI, RTT, RSRP, RSRQ or Time of Arrival (ToA) for signals transmitted by the UE 105) and/or may receive measurements obtained by the UE 105. The one or more base stations or APs may send the measurements to a location server (e.g., the LMF 120) for computation of a location estimate for the UE 105.

Information provided by the gNBs 110*a*, 110*b*, and/or the ng-eNB 114 to the LMF 120 using NRPPa may include timing and configuration information for directional SS or PRS transmissions and location coordinates. The LMF 120 may provide some or all of this information to the UE 105 as assistance data in an LPP and/or NPP message via the NG-RAN 135 and the 5GC 140.

An LPP or NPP message sent from the LMF 120 to the UE 105 may instruct the UE 105 to do any of a variety of things depending on desired functionality. For example, the LPP or NPP message could contain an instruction for the UE 105 to obtain measurements for GNSS (or A-GNSS), WLAN, E-CID, and/or OTDOA (or some other position method). In the case of E-CID, the LPP or NPP message may instruct the UE 105 to obtain one or more measurement quantities (e.g., beam ID, beam width, mean angle, RSRP, RSRQ measurements) of directional signals transmitted within particular cells supported by one or more of the gNBs 110*a*, 110*b*, and/or the ng-cNB 114 (or supported by some other type of base station such as an eNB or WiFi® AP). The UE 105 may send the measurement quantities back to the LMF 120 in an LPP or NPP message (e.g., inside a 5G NAS message) via the serving gNB 110*a* (or the serving ng-cNB 114) and the AMF 115.

As noted, while the communication system 100 is described in relation to 5G technology, the communication system 100 may be implemented to support other communication technologies, such as GSM, WCDMA, LTE, etc., that are used for supporting and interacting with mobile devices such as the UE 105 (e.g., to implement voice, data, positioning, and other functionalities). In some such embodiments, the 5GC 140 may be configured to control different air interfaces. For example, the 5GC 140 may be connected to a WLAN using a Non-3GPP InterWorking Function (N3IWF, not shown FIG. 1) in the 5GC 140. For example, the WLAN may support IEEE 802.11 WiFi® access for the UE 105 and may comprise one or more WiFi® APs. Here, the N3IWF may connect to the WLAN and to other elements in the 5GC 140 such as the AMF 115. In some embodiments, both the NG-RAN 135 and the 5GC 140 may be replaced by one or more other RANs and one or more other core networks. For example, in an EPS, the NG-RAN 135 may be replaced by an E-UTRAN containing eNBs and the 5GC 140 may be replaced by an EPC containing a Mobility Management Entity (MME) in place of the AMF 115, an E-SMLC in place of the LMF 120, and a GMLC that may be similar to the GMLC 125. In such an EPS, the E-SMLC may use LPPa in place of NRPPa to send and receive location information to and from the eNBs in the E-UTRAN and may use LPP to support positioning of the UE 105. In these other embodiments, positioning of the UE 105 using directional PRSs may be supported in an analogous manner to that described herein for a 5G network with the difference that functions and procedures described herein for the gNBs 110*a*, 110*b*, the ng-eNB 114, the AMF 115, and the LMF 120 may, in some cases, apply instead to other network elements such eNBs, WiFi® APs, an MME, and an E-SMLC.

As noted, in some embodiments, positioning functionality may be implemented, at least in part, using the directional SS or PRS beams, sent by base stations (such as the gNBs 110*a*, 110*b*, and/or the ng-eNB 114) that are within range of the UE whose position is to be determined (e.g., the UE 105 of FIG. 1). The UE may, in some instances, use the directional SS or PRS beams from a plurality of base stations (such as the gNBs 110*a*, 110*b*, the ng-eNB 114, etc.) to compute the UE's position.

Figure 2:
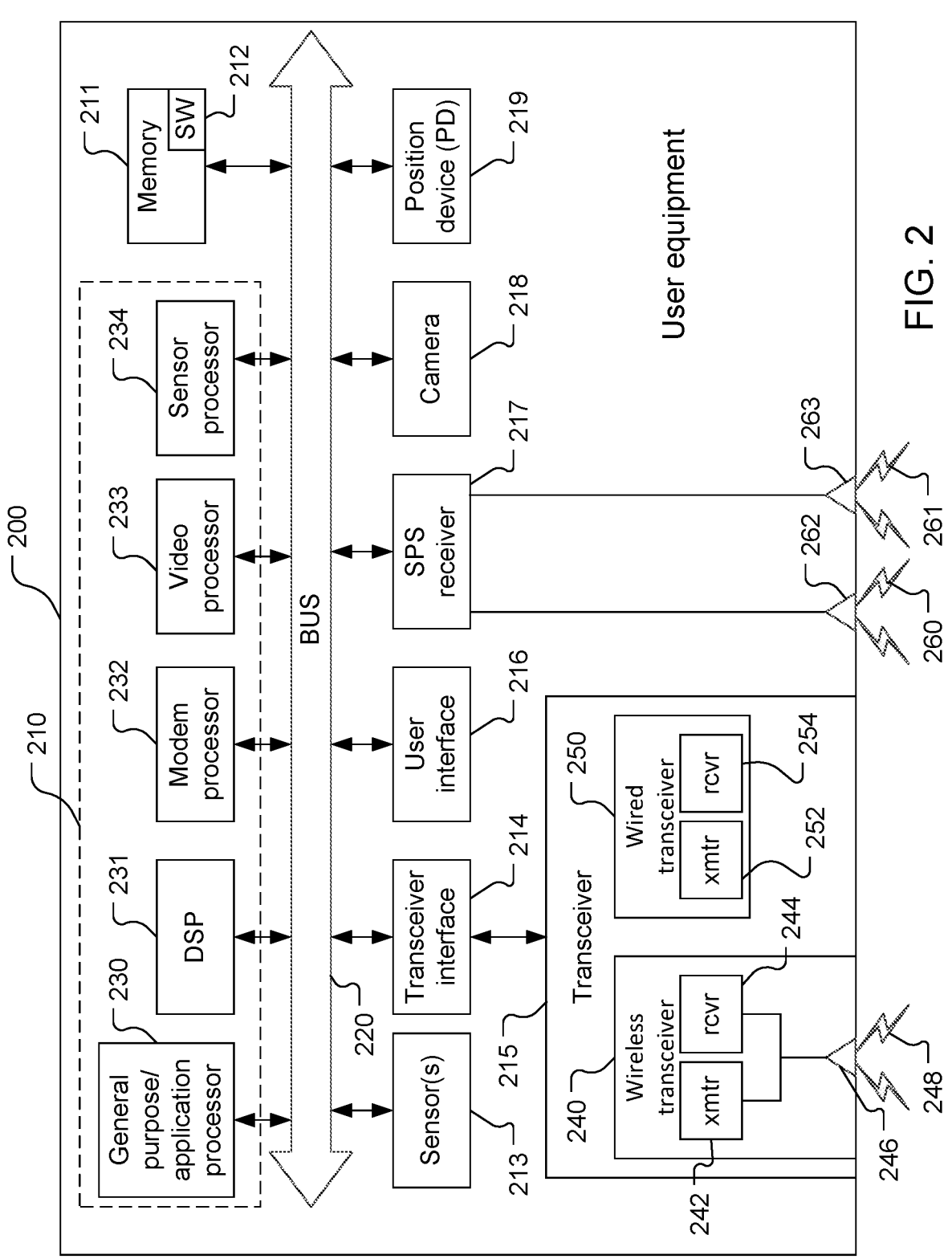
FIG. 2 is a block diagram of components of an example user equipment shown in FIG. 1.

Referring also to FIG. 2, a UE 200 may be an example of one of the UEs 105, 106 and may comprise a computing platform including a processor 210, memory 211 including software (SW) 212, one or more sensors 213, a transceiver interface 214 for a transceiver 215 (that includes a wireless transceiver 240 and/or a wired transceiver 250), a user interface 216, a Satellite Positioning System (SPS) receiver 217, a camera 218, and a position device (PD) 219. The processor 210, the memory 211, the sensor(s) 213, the transceiver interface 214, the user interface 216, the SPS receiver 217, the camera 218, and the position device 219 may be communicatively coupled to each other by a bus 220 (which may be configured, e.g., for optical and/or electrical communication). One or more of the shown apparatus (e.g., the camera 218, the position device 219, and/or one or more of the sensor(s) 213, etc.) may be omitted from the UE 200. The processor 210 may include one or more intelligent hardware devices, e.g., a central processing unit (CPU), a microcontroller, an application specific integrated circuit (ASIC), etc. The processor 210 may comprise multiple processors including a general-purpose/application processor 230, a Digital Signal Processor (DSP) 231, a modem processor 232, a video processor 233, and/or a sensor processor 234. One or more of the processors 230-234 may comprise multiple devices (e.g., multiple processors). For example, the sensor processor 234 may comprise, e.g., processors for RF (radio frequency) sensing (with one or more (cellular) wireless signals transmitted and reflection(s) used to identify, map, and/or track an object), and/or ultrasound, etc. The modem processor 232 may support dual SIM/dual connectivity (or even more SIMs). For example, a SIM (Subscriber Identity Module or Subscriber Identification Module) may be used by an Original Equipment Manufacturer (OEM), and another SIM may be used by an end user of the UE 200 for connectivity. The memory 211 may be a non-transitory storage medium that may include random access memory (RAM), flash memory, disc memory, and/or read-only memory (ROM), etc. The memory 211 may store the software 212 which may be processor-readable, processor-executable software code containing instructions that may be configured to, when executed, cause the processor 210 to perform various functions described herein. Alternatively, the software 212 may not be directly executable by the processor 210 but may be configured to cause the processor 210, e.g., when compiled and executed, to perform the functions. The description herein may refer to the processor 210 performing a function, but this includes other implementations such as where the processor 210 executes software and/or firmware. The description herein may refer to the processor 210 performing a function as shorthand for one or more of the processors 230-234 performing the function. The description herein may refer to the UE 200 performing a function as shorthand for one or more appropriate components of the UE 200 performing the function. The processor 210 may include a memory with stored instructions in addition to and/or instead of the memory 211. Functionality of the processor 210 is discussed more fully below.

The configuration of the UE 200 shown in FIG. 2 is an example and not limiting of the disclosure, including the claims, and other configurations may be used. For example, an example configuration of the UE may include one or more of the processors 230-234 of the processor 210, the memory 211, and the wireless transceiver 240. Other example configurations may include one or more of the processors 230-234 of the processor 210, the memory 211, the wireless transceiver 240, and one or more of the sensor(s) 213, the user interface 216, the SPS receiver 217, the camera 218, the PD 219, and/or the wired transceiver 250.

The UE 200 may comprise the modem processor 232 that may be capable of performing baseband processing of signals received and down-converted by the transceiver 215 and/or the SPS receiver 217. The modem processor 232 may perform baseband processing of signals to be upconverted for transmission by the transceiver 215. Also or alternatively, baseband processing may be performed by the general-purpose/application processor 230 and/or the DSP 231. Other configurations, however, may be used to perform baseband processing.

The transceiver 215 may include a wireless transceiver 240 and a wired transceiver 250 configured to communicate with other devices through wireless connections and wired connections, respectively. For example, the wireless transceiver 240 may include a wireless transmitter 242 and a wireless receiver 244 coupled to an antenna 246 for transmitting (e.g., on one or more uplink channels and/or one or more sidelink channels) and/or receiving (e.g., on one or more downlink channels and/or one or more sidelink channels) wireless signals 248 and transducing signals from the wireless signals 248 to wired (e.g., electrical and/or optical) signals and from wired (e.g., electrical and/or optical) signals to the wireless signals 248. The wireless transmitter 242 includes appropriate components (e.g., a power amplifier and a digital-to-analog converter). The wireless receiver 244 includes appropriate components (e.g., one or more amplifiers, one or more frequency filters, and an analog-to-digital converter). The wireless transmitter 242 may include multiple transmitters that may be discrete components or combined/integrated components, and/or the wireless receiver 244 may include multiple receivers that may be discrete components or combined/integrated components. The wireless transceiver 240 may be configured to communicate signals (e.g., with TRPs and/or one or more other devices) according to a variety of radio access technologies (RATs) such as 5G New Radio (NR), GSM (Global System for Mobiles), UMTS (Universal Mobile Telecommunications System), AMPS (Advanced Mobile Phone System), CDMA (Code Division Multiple Access), WCDMA (Wideband CDMA), LTE (Long Term Evolution), LTE Direct (LTE-D), 3GPP LTE-V2X (PC5), IEEE 802.11 (including IEEE 802.11p), WiFi®, WiFi® Direct (WiFi®-D), Bluetooth®, Zigbee® etc. New Radio may use mm-wave frequencies and/or sub-6 GHZ frequencies. The wired transceiver 250 may include a wired transmitter 252 and a wired receiver 254 configured for wired communication, e.g., a network interface that may be utilized to communicate with the NG-RAN 135 to send communications to, and receive communications from, the NG-RAN 135. The wired transmitter 252 may include multiple transmitters that may be discrete components or combined/integrated components, and/or the wired receiver 254 may include multiple receivers that may be discrete components or combined/integrated components. The wired transceiver 250 may be configured, e.g., for optical communication and/or electrical communication. The transceiver 215 may be communicatively coupled to the transceiver interface 214, e.g., by optical and/or electrical connection. The transceiver interface 214 may be at least partially integrated with the transceiver 215. The wireless transmitter 242, the wireless receiver 244, and/or the antenna 246 may include multiple transmitters, multiple receivers, and/or multiple antennas, respectively, for sending and/or receiving, respectively, appropriate signals.

The SPS receiver 217 (e.g., a Global Positioning System (GPS) receiver) may be capable of receiving and acquiring SPS signals 260, 261 via SPS antennas 262, 263. The SPS antennas 262, 263 are configured to transduce the SPS signals 260, 261 from wireless signals to received signals, e.g., electrical or optical signals, and may be integrated with the antenna 246. The SPS receiver 217 may be configured to process, in whole or in part, the acquired SPS signals 260, 261 for estimating a location of the UE 200. For example, the SPS receiver 217 may be configured to determine location of the UE 200 by trilateration using the SPS signals 260, 261. The general-purpose/application processor 230, the memory 211, the DSP 231 and/or one or more specialized processors (not shown) may be utilized to process acquired SPS signals, in whole or in part, and/or to calculate an estimated location of the UE 200, in conjunction with the SPS receiver 217. The memory 211 may store indications (e.g., measurements) of the SPS signals 260, 261 and/or other signals (e.g., signals acquired from the wireless transceiver 240) for use in performing positioning operations. The general-purpose/application processor 230, the DSP 231, and/or one or more specialized processors, and/or the memory 211 may provide or support a location engine for use in processing measurements to estimate a location of the UE 200.

The position device (PD) 219 may be configured to determine a position of the UE 200, motion of the UE 200, and/or relative position of the UE 200, and/or time. For example, the PD 219 may communicate with, and/or include some or all of, the SPS receiver 217. The PD 219 may work in conjunction with the processor 210 and the memory 211 as appropriate to perform at least a portion of one or more positioning methods, although the description herein may refer to the PD 219 being configured to perform, or performing, in accordance with the positioning method(s). The PD 219 may also or alternatively be configured to determine location of the UE 200 using terrestrial-based signals (e.g., at least some of the wireless signals 248) for trilateration, for assistance with obtaining and using the SPS signals 260, 261, or both. The PD 219 may be configured to determine location of the UE 200 based on a cell of a serving base station (e.g., a cell center) and/or another technique such as E-CID. The PD 219 may be configured to use one or more images from the camera 218 and image recognition combined with known locations of landmarks (e.g., natural landmarks such as mountains and/or artificial landmarks such as buildings, bridges, streets, etc.) to determine location of the UE 200. The PD 219 may be configured to use one or more other techniques (e.g., relying on the UE's self-reported location (e.g., part of the UE's position beacon)) for determining the location of the UE 200, and may use a combination of techniques (e.g., SPS and terrestrial positioning signals) to determine the location of the UE 200. The PD 219 may include one or more of the sensors 213 (e.g., gyroscope(s), accelerometer(s), magnetometer(s), etc.) that may sense orientation and/or motion of the UE 200 and provide indications thereof that the processor 210 (e.g., the general-purpose/application processor 230 and/or the DSP 231) may be configured to use to determine motion (e.g., a velocity vector and/or an acceleration vector) of the UE 200. The PD 219 may be configured to provide indications of uncertainty and/or error in the determined position and/or motion. Functionality of the PD 219 may be provided in a variety of manners and/or configurations, e.g., by the general-purpose/application processor 230, the transceiver 215, the SPS receiver 217, and/or another component of the UE 200, and may be provided by hardware, software, firmware, or various combinations thereof.

Multi-Frequency Range Positioning Signal Processing

Multi-frequency positioning uses positioning signals (e.g., satellite signals, terrestrial network (TN) signals, non-terrestrial network (NTN) signals) from different frequency bands to determine desired information such as pseudoranges between a target device and signal sources, position estimates for the target device, and/or time. Using multi-frequency positioning signals may provide better performance (e.g., position estimate speed and/or accuracy) than using single-frequency positioning signals. For example, using multi-frequency positioning signals may help resolve errors caused by the ionosphere. As another example, using multi-frequency positioning signals may improve performance of high-precision positioning by helping resolve integer ambiguities in carrier-based positioning. As another example, using multi-frequency positioning signals may provide a larger bandwidth that provides better time-of-arrival accuracy. As another example, using multi-frequency positioning signals may provide robustness against jamming (e.g., by switching from a jammed band to an unjammed band). As another example, signals from multiple frequencies may be used to cross check each other for impairments such as multipath or false directions. One or more other performance improvements may also or alternatively be realized. While the discussion herein may focus on SVs as positioning signal sources, the discussion is applicable to other positioning signal sources, e.g., terrestrial-based signal sources and/or other NTN signal sources (e.g., UAVs (unoccupied aerial vehicles)), or combinations of any of such signal sources (i.e., NTN signal sources and/or TN signal sources).

Figure 3:
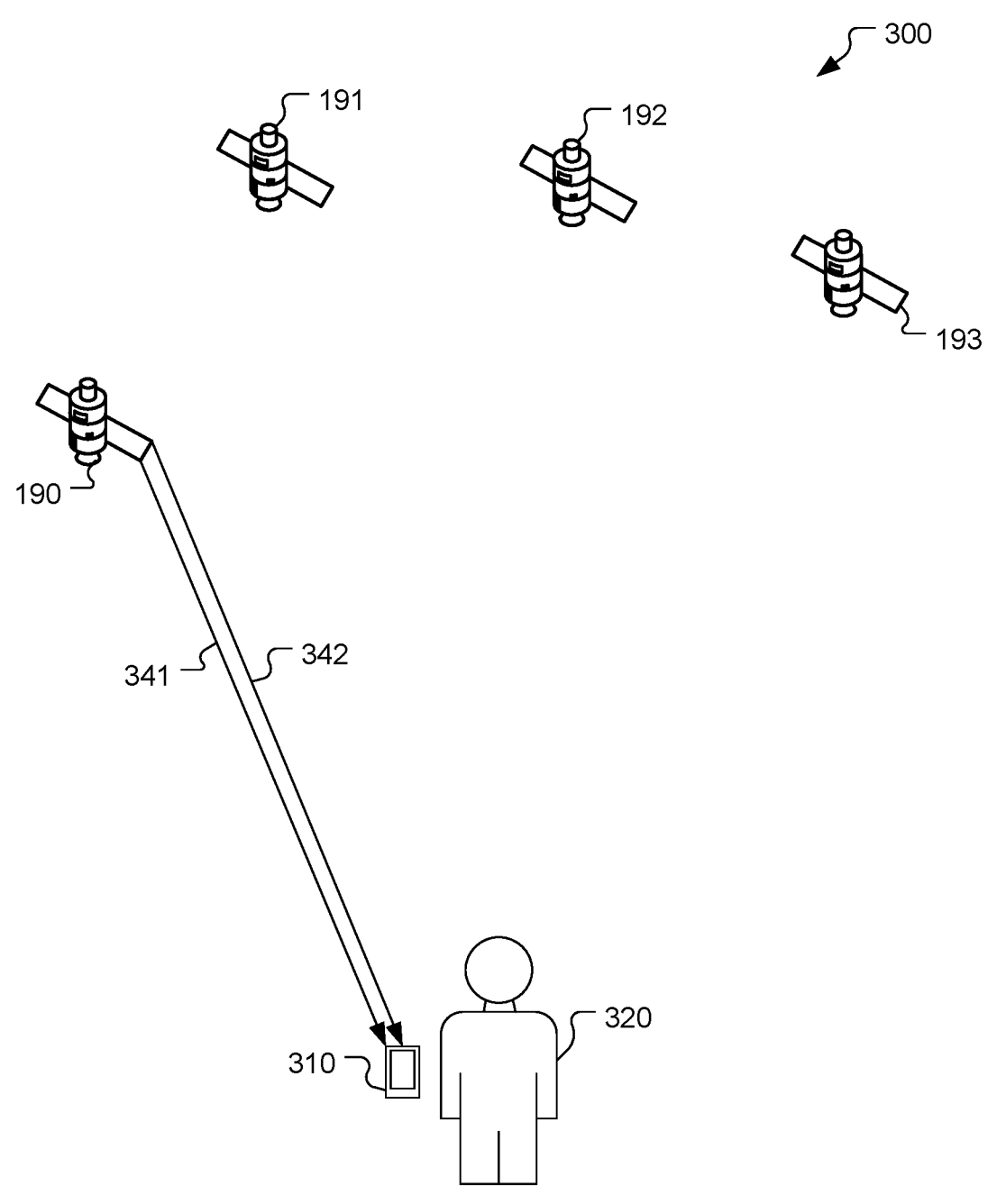
FIG. 3 is a simplified diagram of a navigation environment.

Referring also to FIG. 3, in a navigation environment 300, a UE 310 associated with (e.g., held by) a user 320 may receive satellite signals from the satellites 190-193. The satellites 190-193 may be members of a single satellite constellation, i.e., a group of satellites that are part of a system, e.g., controlled by a common entity such as a government, and orbiting in complementary orbits to facilitate determining positions of entities around the world. Alternatively, the satellites 190-193 may be portions of two or more different satellite constellations, although each of the satellites 190-193 will typically belong to a single satellite constellation. The satellites 190-193 may be, for example, members of the BPS, Galileo, Beidou, GLONASS, or QZSS constellations, respectively. One or more of the satellites 190-193 may transmit multiple satellite signals in different frequency bands, e.g., the satellite 190 may transmit a satellite signal 341 and a satellite signal 342 that have frequencies in different frequency bands, e.g., different ones of the L1, L2, L5, and L6 frequency bands. The terms L1 band, L2 band, L5 band, and L6 band are used herein because these terms are used for the GPS SPS to refer to respective ranges of frequencies. Various receiver configurations may be used to receive satellite signals. For example, a receiver may use separate receive chains for different frequency bands. As another example, a receiver may use a common receive chain for multiple frequency bands that are close in frequency, for example L2, L5, and L6 bands. As another example, a receiver may use separate receive chains for different signals in the same band, for example GPS L1 and GLONASS L1 sub-bands. A single receiver may use a combination of two or more of these examples. These configurations are examples, and other configurations are possible.

Multiple satellite bands are allocated to satellite usage. These bands include the L-band, used for GNSS satellite communications, the C-band, used for communications satellites such as television broadcast satellites, the X-band, used by the military and for RADAR applications, and the Ku-band (primarily downlink communication) and the Ka-band (primarily uplink communications), the Ku and Ka bands used for communications satellites. The L-band is defined by IEEE as the frequency range from 1 to 2 GHz. The L-Band is utilized by the GNSS satellite constellations such as GPS, Galileo, GLONASS, and BeiDou, and is broken into various bands, including L1, L2, L5, and L6. For location purposes, the L1 band has historically been used by commercial GNSS receivers. However, measuring GNSS signals across more than one band may provide for improved accuracy and availability.

Figure 4:
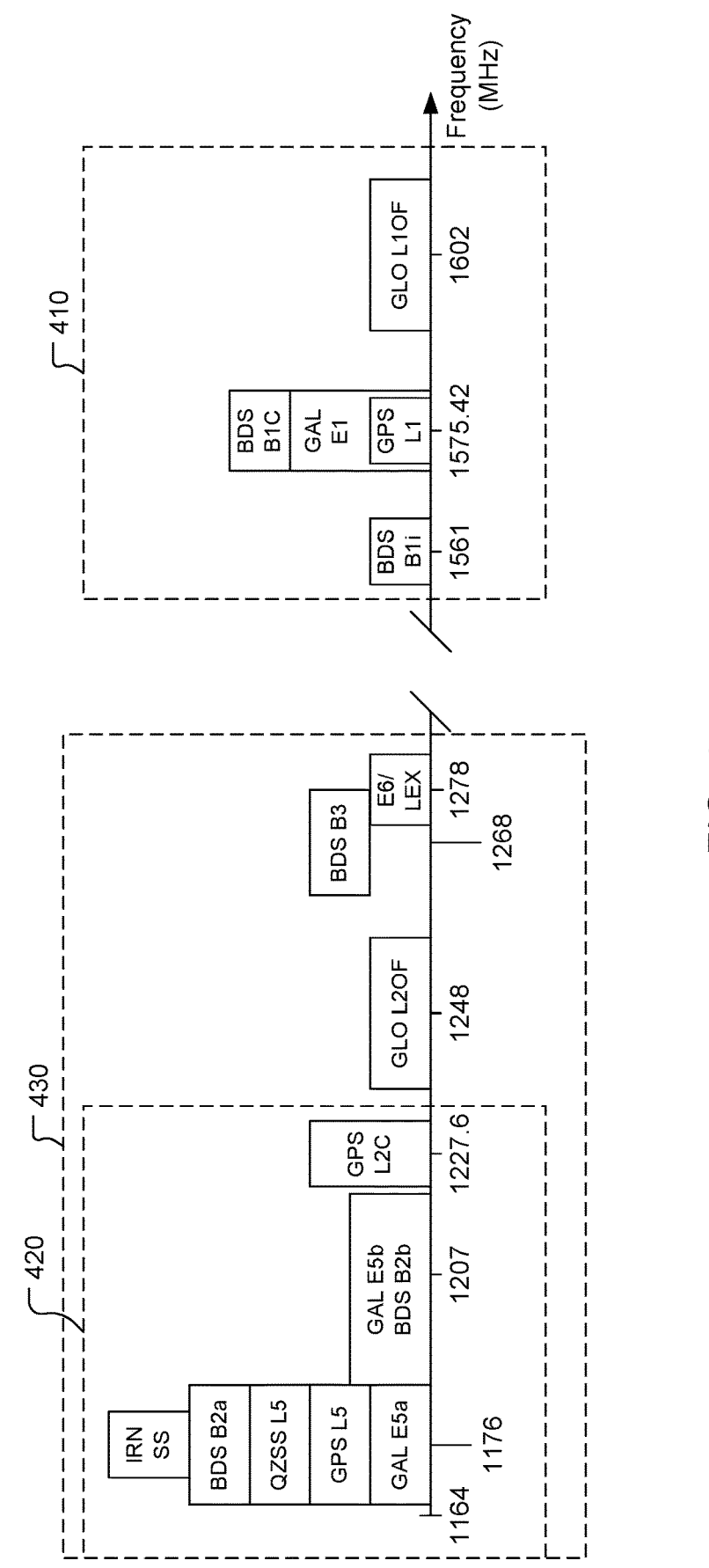
FIG. 4 is a frequency band plot of satellite signals and frequencies of the satellite signals.

Referring also to FIG. 4 (which, like other figures, is not shown to scale), a frequency band plot 400 shows that GNSS constellations operate on several frequencies in the L-Band. The L1 frequency band typically covers frequencies from 1559 MHZ to 1606 MHz and includes L1 signals from GPS, Galileo, Beidou, GLONASS, and QZSS GNSS constellations. These same constellations also transmit concurrently using another frequency in the L2 frequency band and/or the L5 frequency band. The L2 and L5 signals may complement the L1 signals, which have been used for many years. For example, the L5 signals have wider signal bandwidth than the L1 signals, which helps improve positioning performance in multi-path environments. Also, using the L5 signals in addition to the L1 signals provides frequency diversity. The L2 and L5 signals are far enough away in frequency from the L1 signals that different processing paths are typically used to measure the L2 and L5 signals versus the L1 signals. The L1 band extends over a frequency range 410 that is similar to a frequency range 420 over which the L2 and L5 bands extend. Consequently, similar receive chains may be used to process signals in the L1 band and signals in a combination of the L2 and L5 bands. A frequency range 430 that includes the L2, L5, and L6 bands may use a different receive chain (e.g., with a higher sampling rate due to the larger bandwidth of the frequency range 430 compared to the frequency ranges 410, 420) to process the signals. While the discussion herein focuses on the L1, L2, L5, and L6 bands, the discussion (including the claims) are not limited to these bands, nor is the discussion limited to the use of satellite signals in two or three bands.

Signals in the L6 band may have unique properties compared to signals in other frequency bands. For example, GAL E6 and QZSS L6 signals transmit PPP corrections for carrier-phase positioning. As another example, unlike SBAS signals that provide code phase correction data, L6 signals may provide both code phase and carrier phase correction data. As another example, L6 signals have higher chipping rates than L1 signals, similar to L5 signals (e.g., BDS B3 has a chipping rate of about 10 Mcps (mega chips per secons), GAL E6/QZSS L6 have a chipping rate of about 5 Mcpx, and GPS L5/GAL E5a/BDS B2a have chipping rates of about 10 Mcps). As another example, QZSS L6 signals have a unique data modulation method called Code-Shift Keying that allows for transmission at a higher data rate compared to other signal types.

Figure 5:
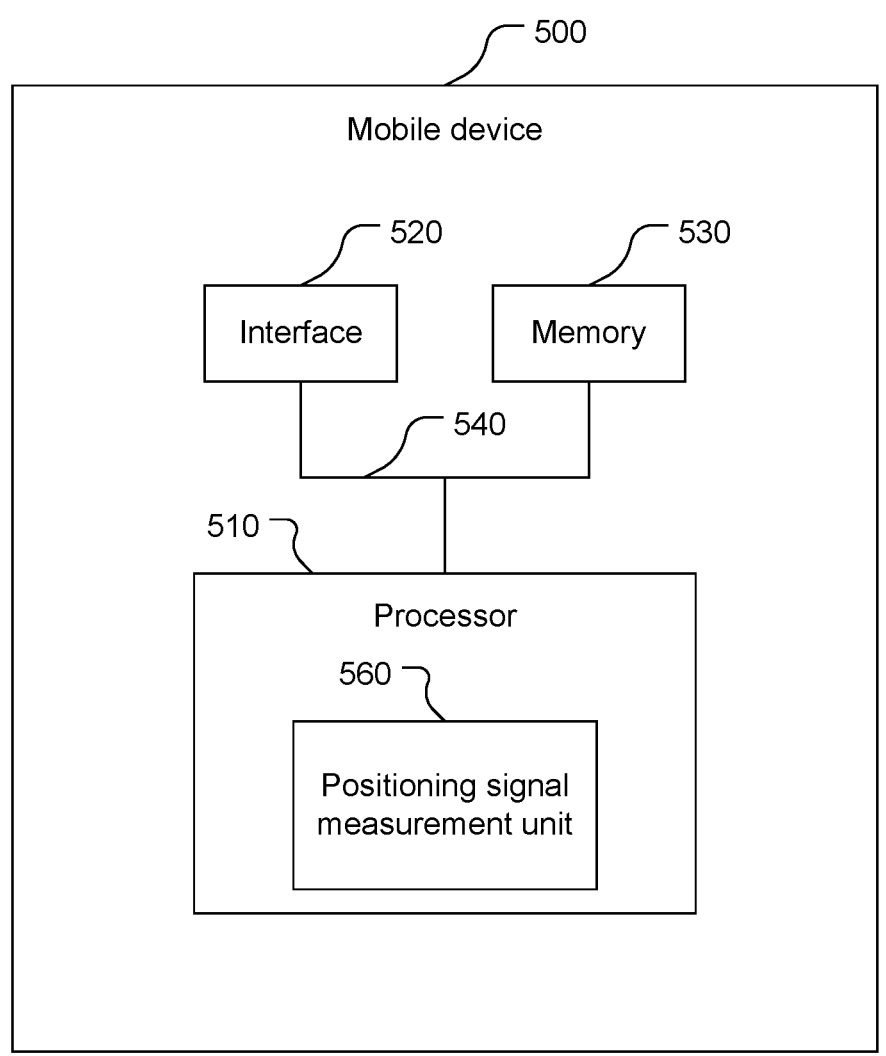
FIG. 5 is a block diagram of an example mobile device.

Referring to FIG. 5, with further reference to FIGS. 1-4, a mobile device 500 includes a processor 510, an interface 520, and a memory 530 communicatively coupled to each other by a bus 540. The mobile device 500 may include some or all of the components shown in FIG. 5, and may include one or more other components such as any of those shown in FIG. 2 such that the UE 200 may be an example of the mobile device 500. The processor 510 may include one or more components of the processor 210. The interface 520 may include one or more of the components of the transceiver 215, e.g., the wireless transmitter 242 and the antenna 246, or the wireless receiver 244 and the antenna 246, or the wireless transmitter 242, the wireless receiver 244, and the antenna 246. Also or alternatively, the interface 520 may include the wired transmitter 252 and/or the wired receiver 254. The interface 520 may include the SPS receiver 217 and the antennas 262, 263 to receive and process satellite signals of different frequencies (e.g., from different frequency bands). The memory 530 may be configured similarly to the memory 211, e.g., including software with processor-readable instructions configured to cause the processor 510 to perform functions.

The description herein may refer to the processor 510 performing a function, but this includes other implementations such as where the processor 510 executes software (stored in the memory 530) and/or firmware. The description herein may refer to the mobile device 500 performing a function as shorthand for one or more appropriate components (e.g., the processor 510 and the memory 530) of the mobile device 500 performing the function. The processor 510 (possibly in conjunction with the memory 530 and, as appropriate, the interface 520) may include a positioning signal measurement unit 560. The positioning signal measurement unit 560 may be configured to perform one or more functions for measuring positioning signals, e.g., controlling receive chains of the mobile device 500 for measuring one or more positioning signals, with the mobile device 500 being configured to perform the function(s). Receive chains may be referred to as RF paths (radio frequency paths).

Figure 6:
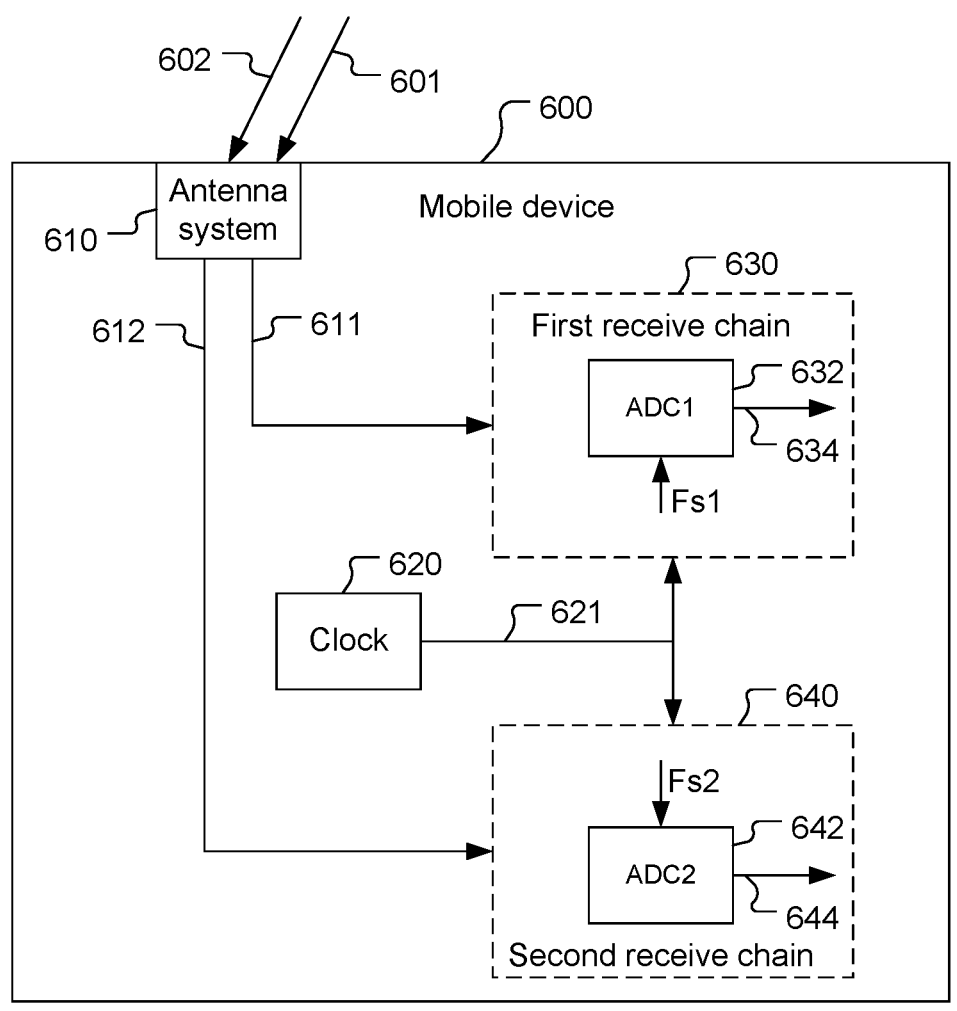
FIG. 6 is a block diagram of an example of the mobile device shown in FIG. 5.

Referring to FIG. 6, with further reference to FIGS. 4 and 5, a mobile device 600, which may be an example of the mobile device 500, includes receiver 610, a clock 620, a first receive chain 630, and a second receive chain 640. The receiver 610 may be configured to receive and convert a first wireless positioning signal 601 in a first frequency range into a first received signal 611. The receiver 610 may be configured to receive and convert a second wireless positioning signal 602 in a second frequency range into a second received signal 612. For example, the first frequency range the receiver 610 may include one or more antennas and may include one or more corresponding front-end circuits in order to transduce the wireless positioning signals 601, 602 into received signals and to provide the received signals 611, 612 to the receive chains 630, 640, respectively. The clock 620 is configured to provide a clock signal 621 with a corresponding clock frequency. The first receive chain 630 is communicatively coupled to the receiver 610 and the clock 620. The first receive chain 630 may include a first ADC 632 (analog-to-digital converter) and may be configured to receive the first received signal 611 and to cause the first ADC 632 to sample the first received signal 611, to produce a first digital signal 634, at a first sampling rate Fs1 that is based on the clock signal 621. For example, the first sampling rate Fs1 (also called a sampling frequency) may be the same as the clock frequency, or a fraction of the clock frequency (e.g., (1/M) times the clock frequency where M is an integer). The second receive chain 640 is communicatively coupled to the receiver 610 and the clock 620. The second receive chain 640 may include a second ADC 642 and may be configured to receive the second received signal 612 and to cause the second ADC 642 to sample the second received signal 612, to produce a second digital signal 644, at a second sampling rate Fs2 that is based on the clock signal 621 and that is different from the first sampling frequency Fs1. For example, the second sampling rate Fs2 may be a fraction of the clock frequency (e.g., (1/N) times the clock frequency where N is an integer and M is inequal to N). One of the first and second sampling rates Fs1. Fs2 may be an integer multiple of the other sampling rate. For example, the second sampling rate Fs2 may be twice the first sampling rate Fs1 and the second frequency range (e.g., the frequency range 430) may be larger than the first frequency range (e.g., the frequency range 410). The use of the term "chain" does not imply or require that components of a chain are in series only. A chain may include components in parallel, e.g., alternative paths, as discussed herein.

Figure 15:
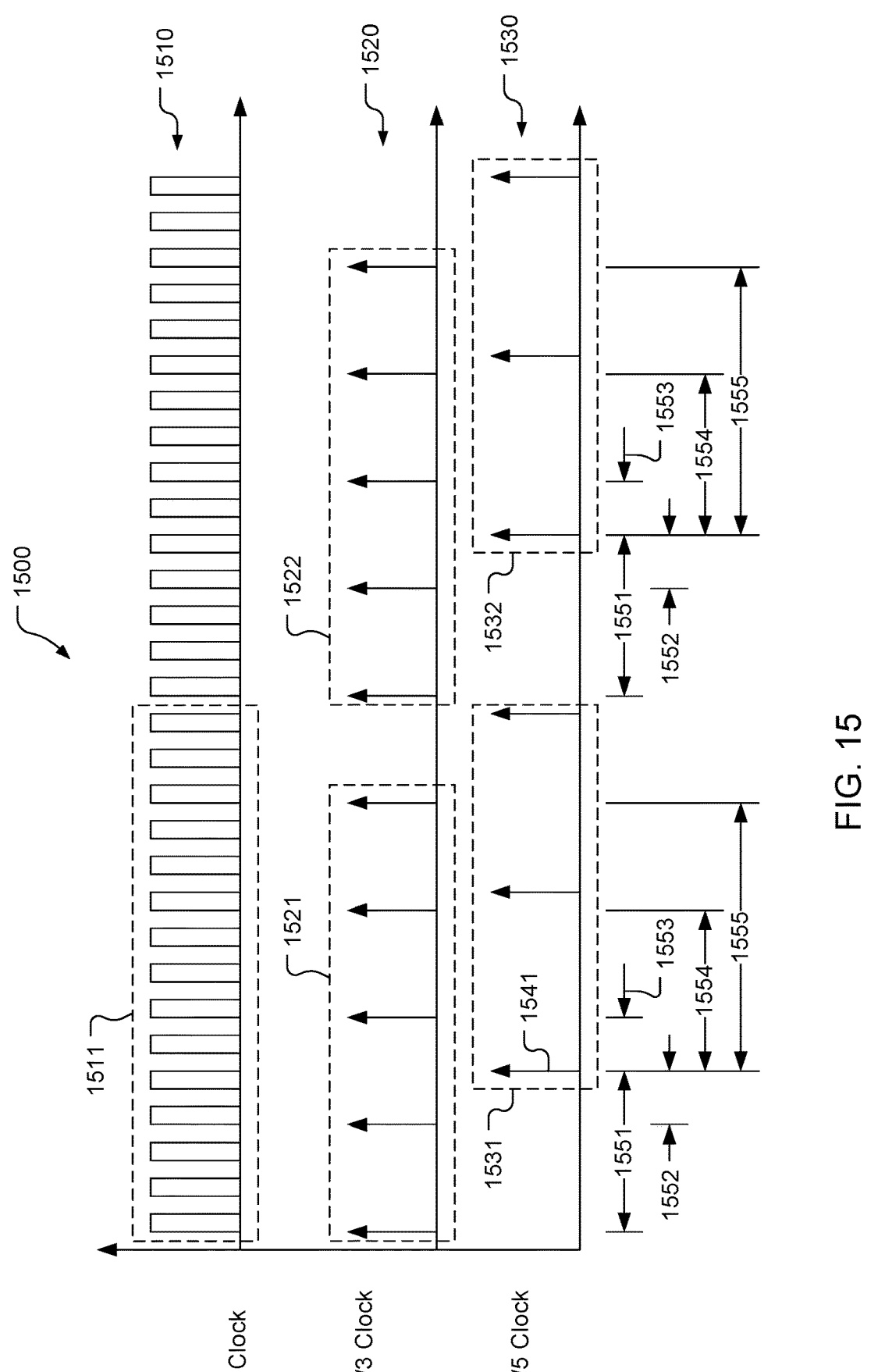
FIG. 15 is a timing diagram of a clock signal and samples by analog-to-digital converters.

The first and second receive chains 630, 640 may be configured to provide synchronized digital signals, e.g., the first digital signal 634 (possibly having been processed by being frequency shifted and/or having a sampling frequency of the first digital signal changed) may be synchronized with the second digital signal 644 (possibly having been processed by being frequency shifted and/or having a sampling frequency of the second digital signal changed). The synchronized signals are produced by having the sampling instances (of corresponding sampling clocks) have a fixed phase relationship, e.g., zero phase offset or a non-zero, fixed phase offset (of a corresponding fixed time offset), such that measurements (e.g., of time of arrival) by each of the receive chains 630, 640 may be related to measurements by the other receive chain. Using a single phase-locked loop followed by a divider to produce sampling clock signals may help ensure a fixed phase relationship between the sampling clock signals. Thus, the received signals 611, 612 will be sampled by the ADCs 632, 642 consistently such that sampling time differences, and corresponding phase relationships (phase differences), are the same for multiple corresponding sampling instances by the ADCs 632, 642. For example, if the first sampling frequency is 1/M times the clock frequency and the second sampling frequency is 1/N times the clock frequency, with M and N being inequal integers, then each of P sample times of the first ADC 632 in each of multiple first sets of samples of the first ADC 632 will have a respective fixed time difference with respect to each of Q sample times of the second ADC 642 in each of multiple second sets of samples of the second ADC 642. Each of the first sets of samples and each of the second sets of samples corresponds to L cycles of the clock frequency, where L is the least common denominator of 1/M and 1/N. For example, referring also to FIG. 15, a timing diagram 1500 shows a clock signal 1510 at the clock frequency, first samples 1520 by the first ADC 632 at the first sampling frequency with M=3, and second samples 1530 at the second sampling frequency with N=5. Sets 1521, 1522 of the first samples 1520 each contain five (5) samples (i.e., P=5) and sets 1531, 1532 of the second samples 1530 each contain three (3) samples (i.e., Q=3). Each of the sets 1521, 1522, 1531, 1532 correspond to a L cycles of the clock signal 1510, with L in this example being 15. Sets of the samples 1520, 1530 correspond where the sets correspond to the same cycles of the clock signal 1510. For example, sets 1521, 1531 correspond because the sets 1521, 1531 both correspond to a set 1511 of L cycles of the clock signal 1510. Similarly, the set 1522 corresponds to the set 1532. Each sample in each of the sets 1521, 1522, 1531, 1532 has a respective sampling time difference with respect to each sample in a corresponding set of samples that is substantially fixed (i.e., substantially the same difference, within variation due to analog effects) for different sets, with corresponding substantially fixed phase relationships of the sampled signals. For example, a sample 1541 is the first sample in the set 1531 and has sampling time differences 1551, 1552, 1553, 1554, 1555 with respect to samples 1561, 1562, 1563, 1564, 1565, respectively, in the set 1521 corresponding to the set 1531. A sample 1571, being in the same sample position in the set 1532 as the sample 1541 in the set 1531 will have the same sampling time differences 1551, 1552, 1553, 1554, 1555 with respect to samples 1581, 1582, 1583, 1584, 1585, respectively, in the set 1522 corresponding to the set 1532.

The processor 510, e.g., the positioning signal measurement unit 560, may use the sampling time differences (which may be measured or otherwise determined) and/or corresponding phase differences of sampled signals in order to use measurements by the receive chains 630, 640 to determine position information. The processor 510 may combine pseudorange measurements from different bands to determine a position estimate, with relative receiver delays for each band accounted for in the calculation of the position estimate. Re-sampling, e.g., by variable re-samplers, may be synchronized by using a single re-sampler module to facilitate calculation of the position estimate.

The first digital signal 634 may refer to any signal downstream of the first ADC 632, e.g., as frequency shifted and/or re-sampled or decimated by appropriate downstream circuitry. The second digital signal 644 may refer to any signal downstream of the second ADC 642, e.g., as frequency shifted and/or re-sampled or decimated by appropriate downstream circuitry. Similarly, the first received signal 611 and the second received signal 612 may refer to any signal downstream of the receiver 610 in the first receive chain 630 (or beyond) or in the second receive chain 640 (or beyond), respectively.

Figure 7:
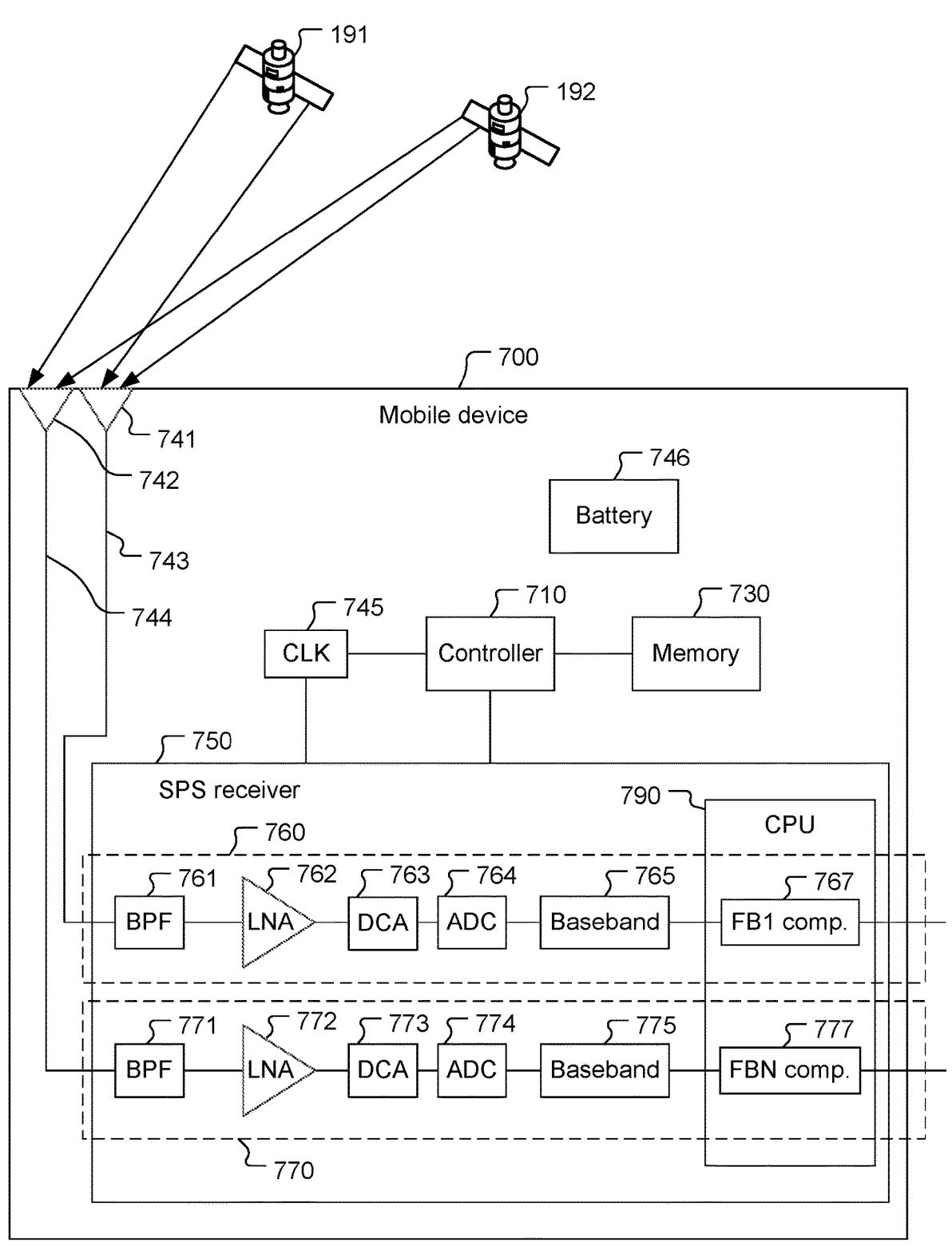
FIG. 7 is a block diagram of an example of the mobile device shown in FIG. 6.

Referring to FIG. 7, with further reference to FIGS. 1-6, a mobile device 700, which may be an example of the mobile device 500 and the mobile device 600, includes a controller 710, a memory 730, antennas 741, 742, and an SPS receiver 750, and a clock 745 communicatively coupled to each other, and a battery 746 connected to components of the mobile device 700 that use energy to operate. The controller 710 may be a portion of the positioning signal measurement unit 560 (possibly in combination with the memory 730) and the memory 730 may be an example of the memory 530. The controller 710 may be implemented by the processor 510 and may be configured to control components of the SPS receiver 750, e.g., as discussed herein. The antennas 741, 742 may be configured to transduce satellite signals of different frequency bands (e.g., the L1 band, and a combination of the L2, L5, and L6 bands, respectively) into received signals 743, 744 that are provided to the SPS receiver 750 via respective electrical signal lines. The antennas 741, 742 may receive signals of different frequency bands, but may be configured to transduce insufficient amounts of energy of signals for which the antennas 741, 742 are not configured (e.g., designed and built (and possibly tuned)) to transduce (e.g., insufficient for accurate measurement). A single antenna may be used instead of the antennas 741, 742, with the single antenna being configured to receive and transduce signals of desired frequency bands (e.g., L1, L2, L5, and L6). While SV signals are assumed, and thus an SPS receiver is assumed, the SPS receiver 750 may be a receiver configured to receive and process one or more non-SV signals (e.g., other NTN positioning signals and/or TN positioning signals) instead of or in addition to one or more SV signals.

The SPS receiver 750 includes multiple receive chains 760, 770 for measuring satellite signals of different frequencies. The satellite signals may have frequencies in different but overlapping ranges of frequencies (with one or more shared frequencies), or in separate (non-overlapping) ranges of frequencies (with no shared frequency). The discussion herein refers to the receive chains 760, 770 being for different, non-overlapping frequency bands but this is an example and not limiting of the disclosure, including the claims. Further, while two receive chains are shown in FIG. 7, the mobile device 700 may include more than two receive chains and/or may have multiple branches within a receive chain (as discussed further below), e.g., for measuring satellite signals having frequencies in more than two different frequency bands (e.g., different sub-bands). The receive chains 760, 770 may, for example, be configured to measure satellite signals in the L1 and L2/L5/L6 bands, respectively, although this is an example and not limiting of the disclosure as either or both of the receive chains 760, 770 may be configured to measure signals of other frequencies or frequency bands, and/or other receive chains may be included in the mobile device 700.

The receive chains 760, 770 include respective components for measuring satellite signals, in this example, of different frequency ranges, and are connected to different respective antennas, here the antennas 741, 742. The frequency ranges corresponding to the receive chains 760, 770 may differ enough such that separate, differently-configured antennas are used to transduce respective satellite signals for the receive chains 760, 770. The receive chain 760 includes the antenna 741, a BPF 761 (bandpass filter), an LNA 762 (low-noise amplifier), a DCA 763 (Digital Controlled Amplifier for down-conversion, signal conditioning/filtering, and amplification), an ADC 764 (analog-to-digital converter), a baseband block 765, and a computational block 767. The BPF 761 is configured to pass signals of frequencies within a desired frequency range, e.g., the L1 band, with little if any attenuation, and to significantly attenuate signals of frequencies outside the desired frequency band of the BPF 761. The LNA 762 (e.g., an extremely-low-noise amplifier) is configured to amplify signals passed by the BPF 761. A further BPF may be disposed between the LNA 762 and the DCA 763. The DCA 763 (which may be called a PGA (programmable gain amplifier) and which may be a portion of an RFIC (Radio Frequency Integrated Circuit)) is configured to down convert the analog amplified signals output by the LNA 762 to a baseband frequency, to perform signal conditioning and/or filtering (e.g., anti-aliasing filtering), and amplification in addition to the amplification by the LNA 762. The ADC 764 is configured to convert the analog signals output by the DCA 763 into digital signals. The baseband block 765 is configured to perform intense signal processing of correlating the digital signals output by the ADC 764 with respective reference pseudorandom signals (e.g., Gold codes) by integrating the signals (e.g., for 1 ms) and using the integrated signals for further processing to determine whether the correlation results have sufficient energy to indicate a true signal. The ADC 764 and the baseband block 765 may be portions of a modem of the mobile device 700. The computational block 767, which here is a portion of a CPU 790 (Central Processing Unit), is configured to perform one or more computations on the signals output by the baseband block 765 to determine one or more satellite signal parameters (e.g., pseudorange, $CN_0$ (carrier-to-noise-density ratio, also referred to as C/No), Doppler, carrier phase, etc.). The computational block 767 comprises a portion of the CPU 790 for performing computations for the receive chain 760, namely corresponding to signals in the desired frequency band of the BPF 761. Thus, the computational block 767 is shown as being for computation for frequency band 1 (FB1). The CPU 790 may be a portion of the processor 510. The receive chain 770 includes the antenna 742, a BPF 771, an LNA 772, a DCA 773, an ADC 774, a baseband block 775, and a computational block 777. The BPF 771 is configured to pass signals of frequencies within a desired frequency range, e.g., the L2/L5/L6 bands, with little if any attenuation, and to significantly attenuate signals of frequencies outside the desired frequency band of the BPF 771. The LNA 772, DCA 773, ADC

774, baseband block 775, and computational block 777 are configured similarly to the LNA 762, DCA 763, ADC 764, baseband block 765, and computational block 767, but configured, as appropriate, for processing signals corresponding to signals of the desired frequency of the BPF 771. Thus, the computational block 777 is shown as being for computation for frequency band N (FBN), as there may be N receive chains, with N being an integer of two or greater. A further BPF may be disposed between the LNA 772 and the DCA 773. The DCA 773 may be a portion of the RFIC and the ADC 774 and the baseband block 775 may be portions of the modem.

The receive chains 760, 770 may have respective associated characteristics, e.g., due to different signal characteristics of the signals in the respective frequency bands that the receive chains 760, 770 are configured to measure and/or due to different characteristics of one or more components of the receive chains 760, 770, respectively. For example, the receive chain 770 may have a higher positioning accuracy than the receive chain 760 and the receive chain 760 may have a faster acquisition speed than the receive chain 770 with the receive chain 760 being associated with L1 signals and the receive chain 770 being associated with L2/L5/L6 signals that have a higher bandwidth than the L1 signals.

The ADC 764 and the ADC 774 may be triggered to sample received signals (as provided by the DCAs 763, 773) at different sampling rates. For example, with the receive chain 770 configured to receive and process signals over a wider range of frequencies than the receive chain 760, the ADC 774 may be triggered to sample the signals received by the receive chain 770 at a higher sampling rate than a sampling rate at which the ADC 764 is triggered to sample respective signals received by the receive chain 760. For example, in general, a relationship of sampling frequencies of the ADCs 764, 774 may be given by $$iF_{s2} = jF_{s1} \tag{1}$$

where i and j are integers, $F_{s1}$ is the sampling frequency of the ADC 764 (e.g., for the L1 band), and $F_{s2}$ is the sampling frequency of the ADC 774 (e.g., for the L2/L5/L6 bands). In an example, i may equal 1 and j may be an integer greater than 1 such that $$F_{s2} = nF_{s1} \tag{2}$$

For example, j may equal 2 such that the sampling rate of the ADC 774 is twice the sampling rate of the ADC 764 (i.e., $F_{s2}=2F_{s1}$). For example, the sampling rate $F_{s2}$ of the ADC 774 may be 160× (i.e., 160 times 1.023 MHz) and the sampling rate $F_{s1}$ of the ADC 764 may be 80× (i.e., 80 times 1.023 MHz). The ADC 774 may be triggered, as discussed further below, to have different sampling frequencies, e.g., depending on mode of the receive chain 770, e.g., for processing signals in the L2/L5 bands or in the L2/L5/L6 bands.

The sampling rates (also known as sampling frequencies) of the ADCs 764, 774 may be derived from the same reference signal, e.g., a clock signal from the clock 745. This may help ensure that signals provided to the computational blocks 767, 777 are phase aligned. The sampling rate of the ADC 764 may be the same sampling rate used by legacy mobile devices for processing signals in the L1 band (or other band processed by a legacy mobile device) such that the receive chain 760 may be the same as, or at least similar to, a legacy receive chain, such that legacy parts/design may be used.

Figure 8:
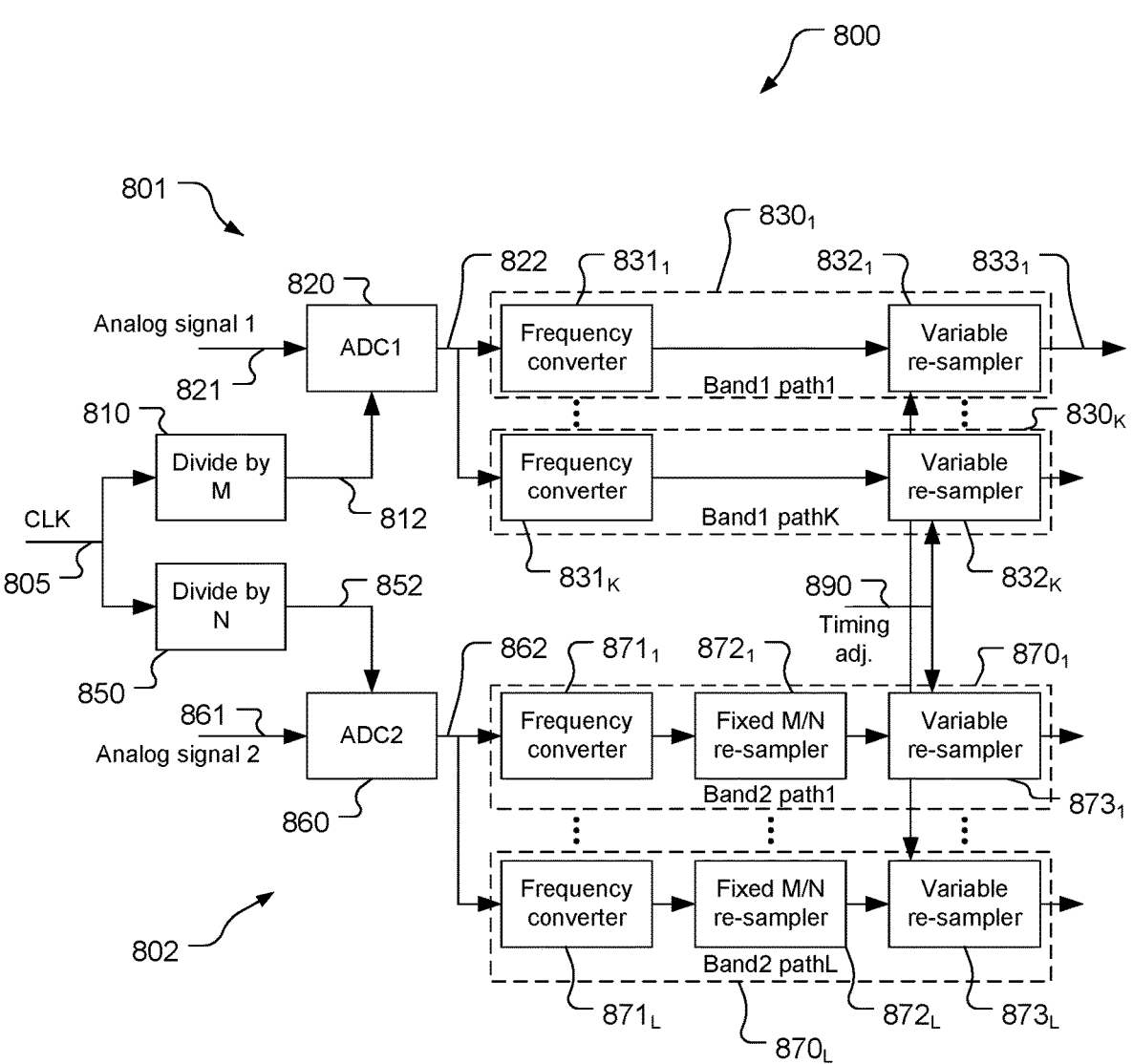
FIG. 8 is a block diagram of a positioning signal receiver.

Referring also to FIG. 8, an example positioning signal receiver 800 includes a first receive chain 801 and a second receive chain 802. The first receive chain 801 includes a first frequency divider 810, here a divide-by-M circuit, communicatively coupled to a clock (not shown) and configured to divide a frequency of a clock signal 805 ($CL_K$) by an integer M to produce a first divided-clock signal 812. The first frequency divider 810 may be communicatively coupled to a first ADC 820 to provide the first divided-clock signal 812 to the first ADC 820 to trigger the first ADC 820 to sample a first analog signal 821 at the frequency of the first divided-clock signal 812. The first ADC 820 may be communicatively coupled to an receiver to receive the first analog signal 821 and to convert the first analog signal 821 to a first digital signal 822 by sampling the first analog signal 821 at the frequency of the first divided-clock signal 812, i.e., a first sampling frequency. The first ADC 820 may be communicatively coupled to baseband circuits $830_1$-$830_K$ each corresponding to a respective path for a respective band of frequencies within a first frequency range (e.g., the frequency range 410). The baseband circuits $830_1$-$830_K$ may each comprise a respective one of frequency converters $831_1$-$831_K$ and variable re-samplers $832_1$-$832_K$. The frequency converters $831_1$-$831_K$ may each be configured to provide a respective frequency shift (which may be a positive frequency shift or a negative frequency shift) to move a center frequency of a desired signal to a baseband frequency. One or more of the frequency converters $831_1$-$831_K$ may be omitted from the respective baseband circuit(s) or provide zero frequency shift. The frequency converters $831_1$-$831_K$ may be mixers. The variable re-samplers $832_1$-$832_K$ may be configured to provide respective interpolation operations using a timing adjustment signal 890 shared by all the variable re-samplers $832_1$-$832_K$ such that sampling rates of corresponding output signals (e.g., an output signal 8331) are synchronized with a reference time, e.g., GPS time. The variable re-samplers $832_1$-$832_K$ may include feedback loops to adjust a re-sampling frequency and phase to keep the output signals synchronized.

The second receive chain 802 includes a second frequency divider 850, here a divide-by-N circuit, communicatively coupled to the clock and configured to divide a frequency of the clock signal 805 by an integer N to produce a second divided-clock signal 852. The integer N may be different from the integer M, e.g., with the integer N being one (1) is an example. The second frequency divider 850 may be communicatively coupled to a second ADC 860 to provide the second divided-clock signal 852 to the second ADC 860 to trigger the second ADC 860 to sample a second analog signal 861 at the frequency of the second divided-clock signal 852. The second ADC 860 may be communicatively coupled to the receiver to receive the second analog signal 861 and to convert the second analog signal 861 to a second digital signal 862 by sampling the second analog signal 861 at the frequency of the second divided-clock signal 852, i.e., a second sampling frequency. The second ADC 860 may be communicatively coupled to baseband circuits $870_1$-$870_1$ each corresponding to a respective path for a respective band of frequencies within a second frequency range (e.g., the frequency range 430). The baseband circuits $870_1$-$870_1$ may each comprise a respective one of frequency converters $871_1$-$871_L$, re-samplers $872_1$-$872_L$, and variable re-samplers $873_1$-$873_L$. The re-samplers $872_1$-

$872_1$ are sampling adjustment circuits and in this example are fixed N/M re-samplers configured to re-sample the second digital signal 862 (as possibly frequency shifted by a respective one of the frequency converters $871_1$-$871_L$) at a sampling rate of N/M times the second divided-clock signal 852.

Referring also to FIG. 9, the re-samplers $872_1$-$872_1$ are configured such that the sampling rate of the first digital signal and the second digital signal entering the respective variable re-samplers $832_1$-$832_K$. $873_1$-$873_L$ will be the same. A first analog signal 910 may be sampled by the first ADC 820 at a first sampling rate to produce samples 915. A second analog signal 920 may be sampled by the second ADC 860 at a second sampling rate, e.g., in this example being twice the first sampling rate, to provide samples 925. In this example, there is zero phase offset in the trigger signals, i.e., the first divided-clock signal 812 and the second divided-clock signal 852, for the ADCs 820, 860, but a fixed phase offset may exist between these signals. After re-sampling by a respective one of the re-samplers $872_1$-$872_L$, the samples 925 have been converted to samples 930 having a sampling rate equal to the samples 915.

Figure 10:
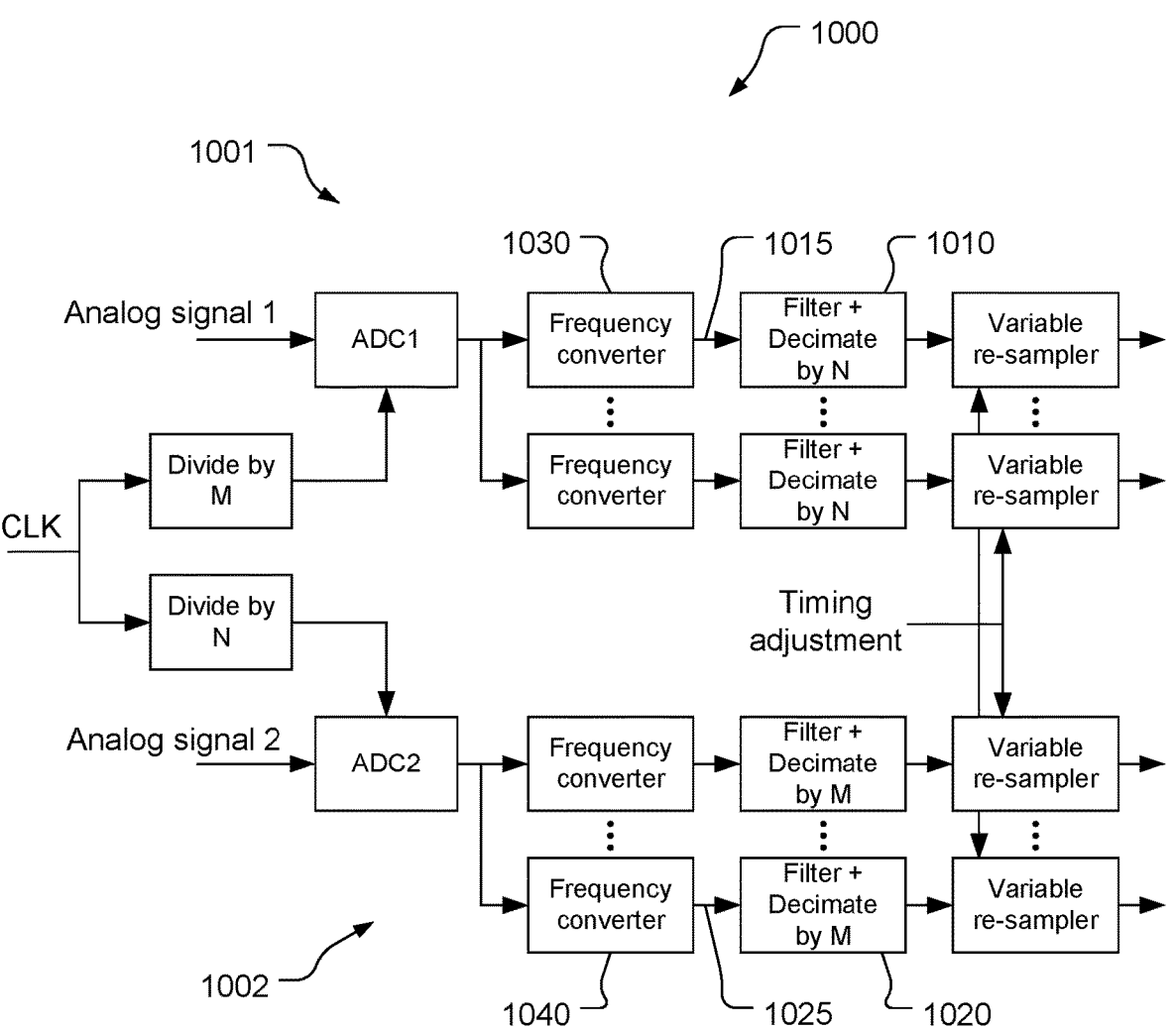
FIG. 10 is a block diagram of another positioning signal receiver.

Referring also to FIG. 10, an example positioning signal receiver 1000 includes a first receive chain 1001 and a second receive chain 1002. The receive chains 1001, 1002, similar to the positioning signal receiver 800, include respective frequency dividers and ADCs, and respective baseband circuits include respective frequency converters and variable re-samplers. In the positioning signal receiver 1000, however, the baseband processors include respective filter and decimation circuits. For example, the first receive chain 1001 includes a filter and decimation circuit 1010 communicatively coupled to a frequency converter 1030 and configured to filter and decimate an output signal 1015 from the frequency converter 1030. In particular, a decimation portion of the filter and decimation circuit 1010 is a sampling adjustment circuit configured to decimate the output signal 1015 by a factor of N (leaving 1/N of the samples of the output signal 1015, where the second receive chain 1002 has the clock frequency divided by N for triggering the ADC of the second receive chain 1002). Complimentarily, the second receive chain 1002 includes a filter and decimation circuit 1020 communicatively coupled to a frequency converter 1040 and configured to filter and decimate an output signal 1025 from the frequency converter 1040. A decimation portion of the filter and decimation circuit 1020 is configured to decimate the output signal 1025 by a factor of M (leaving 1/M of the samples of the output signal 1025, where the first receive chain 1001 has the clock frequency divided by M for triggering the ADC of the first receive chain 1001). Consequently, the digital signal input to the respective variable re-samplers with have the same sampling rate in both the first receive chain 1001 and the second receive chain 1002. The filter and decimation circuits may use fixed decimation so that inputs to the variable re-samplers may be backward compatible to legacy baseband circuits, which may save cost re-designing baseband processors and/or save material cost of non-legacy baseband processors. The variable re-samplers may, however, be configured such that the fixed decimations may be omitted. The frequency converters may provide frequency conversion before decimation by the filter and decimation circuits to avoid losing information in desired frequencies that may be lost in the decimation process if frequency conversion is not performed before the decimation (because during decimation, signals of some frequencies (e.g., above a threshold) may be lost).

Figure 11:
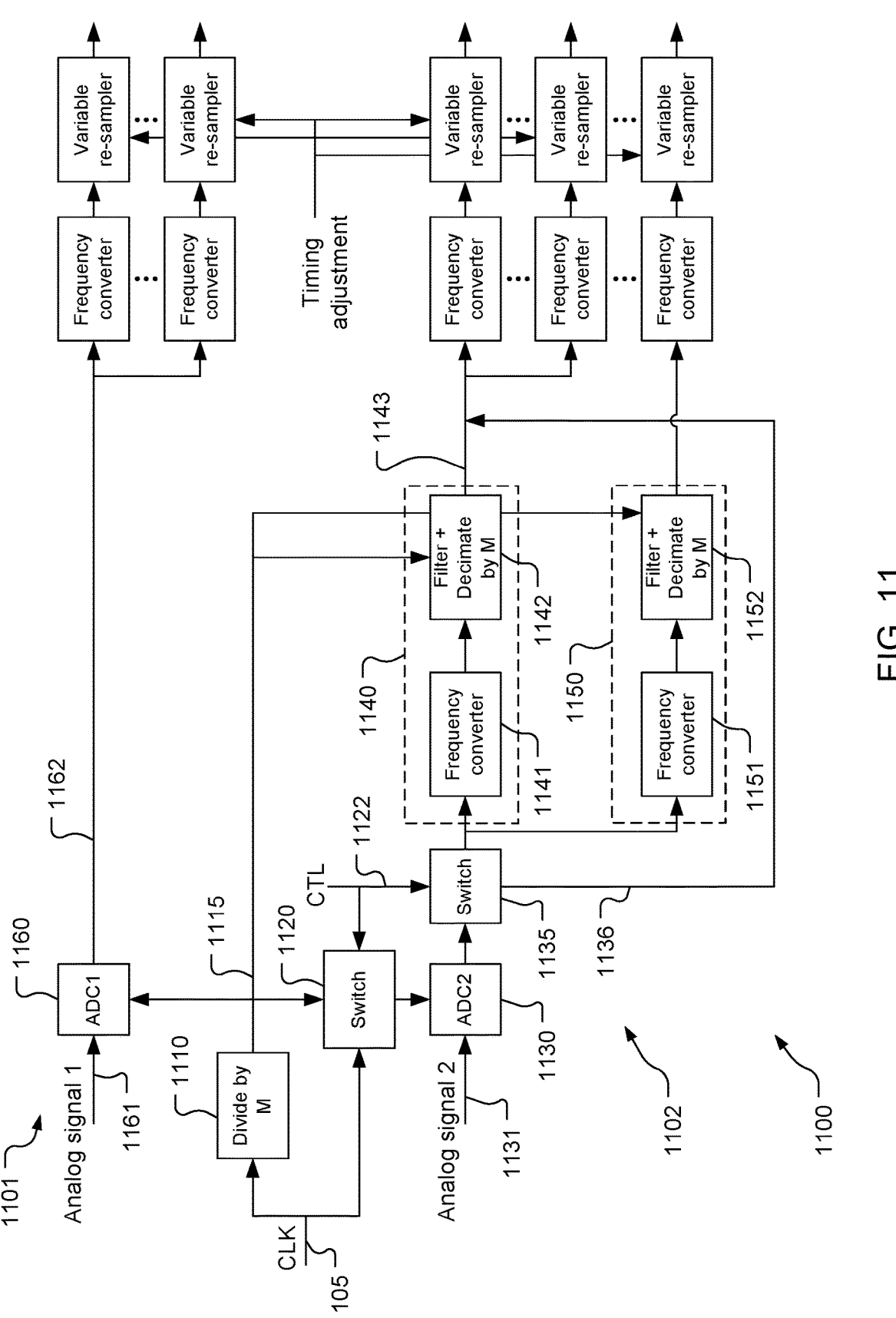
FIG. 11 is a block diagram of another positioning signal receiver.

Referring also to FIG. 11, an example positioning signal receiver 1100 include a first receive chain 1101 and a second receive chain 1102 and is configured to have the second receive chain 1002 selectively operated using the same ADC sampling frequency as the first receive chain 1001 or a different ADC sampling frequency as the first receive chain 1001. A frequency divider 1110 may, as in this example, be shared by the first receive chain 1001 and the second receive chain 1002. The frequency divider 1110 may be communicatively coupled to a clock (not shown) and configured to divide a clock frequency of a clock signal 1105 ($CL_K$) by an integer M to produce a divided-clock signal 1115. The frequency divider 1110 may be configured and communicatively coupled to provide the divided-clock signal 1115 to a switch 1120 of the second receive chain 1102 and to a first ADC 1160 of the first receive chain 1101.

The switch 1120, e.g., a MUX (multiplexer), may be configured to selectively provide the clock signal 1105 or the divided-clock signal 1115 to a second ADC 1130 of the second receive chain 1102 for different modes of use. For example, the switch 1120 may, based on a control signal 1122 (e.g., from the controller 710), provide either the clock signal 1105 in a first mode to the second ADC 1130 or provide the divided-clock signal 1115 in a second mode to the second ADC 1130. The divided-clock signal 1115 may be provided to the second ADC 1130 such that both the first ADC 1160 and the second ADC 1130 operate at the same sampling frequency, e.g., based on the receive chains 1101, 1102 both processing signals over similar ranges of frequencies, e.g., the frequency ranges 410, 420, respectively. The clock signal 1105 may be provided to the second ADC 1130 and the divided-clock signal 1115 provided to the first ADC 1160 to cause the ADCs 1130, 1160 to operate at different sampling frequencies, e.g., based on the receive chains 1101, 1102 processing signals over different ranges of frequencies, e.g., the frequency ranges 410, 430, respectively. The first ADC may be configured to convert a first analog signal 1161 to a first digital signal 1162 that is provided to one or more baseband circuits.

An output of the second ADC 1130 may be coupled to a switch 1135 that may be configured to selectively couple the second ADC 1130 to pre-processing circuits or to baseband circuits, bypassing the pre-processing circuits. For example, the switch 1135 may be configured to respond to the control signal 1122 to couple the second ADC 1130 to pre-processing circuits 1140, 1150 in the first mode (with the switch 1120 providing the (undivided) clock signal 1105 to the second ADC 1130 such that the second ADC 1130 samples the analog signal 1131 at the frequency of the clock signal 1105 (e.g., 160×)). The switch 1135 may be configured to respond to the control signal 1122 by coupling the second ADC 1130 to a line 1136 to bypass the pre-processing circuits 1140, 1150 in the second mode (with the switch 1120 providing the divided-clock signal 1115 to the second ADC 1130 such that the second ADC 1130 samples the analog signal 1131 at the frequency of the divided-clock signal 1105 (e.g., 80×)). The pre-processing circuits 1140, 1150 may include frequency converters 1141, 1151 and filter and decimation circuits 1142, 1152, respectively. The pre-processing circuits 1140, 1150 may be configured to adjust signal center frequencies that are present in a larger frequency range (e.g., the frequency range 430) corresponding to use of a higher sampling frequency, e.g., of the clock signal 1105, for the second ADC 1130 but that are not present in a smaller frequency range (e.g., the frequency range 420) corresponding to use of a lower sampling frequency, e.g., the sampling frequency of the divided-clock signal 1115, for the second ADC 1130. The pre-processing circuits 1140, 1150 may be used for the larger frequency band such that the same baseband circuits may be used for the first and second modes, and may be legacy baseband circuits. Filter portions of the filter and decimation circuits 1142, 1152 focus received signals to respective desired frequencies. The pre-processing circuit 1140 may provide an output digital signal 1143 to one or more baseband circuits (e.g., to the frequency converter(s) of the baseband circuit(s)). The second ADC 1130 may be configured to support multiple bands with each band corresponding to one or more paths each corresponding to a respective pre-processing circuit (e.g., corresponding to a particular range of desired frequencies).

Figure 12:
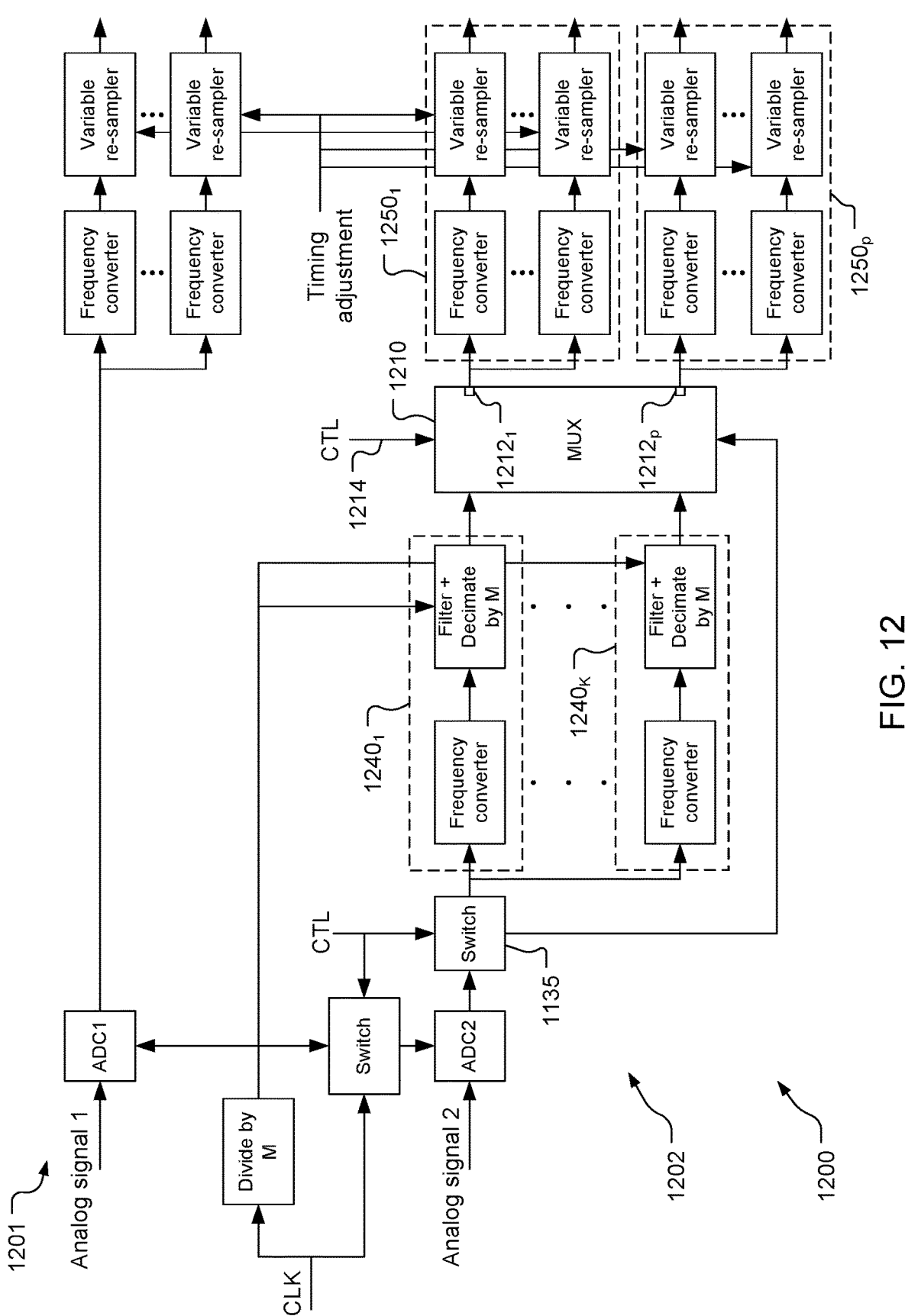
FIG. 12 is a block diagram of another positioning signal receiver.

Referring also to FIG. 12, an example positioning signal receiver 1200 includes a first receive chain 1201 and a second receive chain 1202. The receiver 1200 is similar to the receiver 1100 except that a MUX 1210 includes respective inputs coupled to outputs of pre-processing circuits $1240_1$-$1240_K$ and to the switch 1135, and is configured to selectively couple any of the inputs to a respective output of the MUX 1210. Each output of the MUX 1210 may be coupled to a corresponding baseband circuit that may include one or more paths. In this example, a first output $1212_1$ of the MUX 1210 is coupled to a baseband circuit $1250_1$ and a $p^{th}$ output $1212_p$ of the MUX 1210 is coupled to a baseband circuit $1250_p$. Each of the baseband circuits $1250_1$. $1250_p$ may have one or more paths (each with a frequency converter and a variable re-sampler). The MUX 1210 may be configured to respond to a control signal 1214 (e.g., from the controller 710) to selectively couple any of the inputs of the MUX 1210 to any of the outputs of the MUX 1210.

Figure 13:
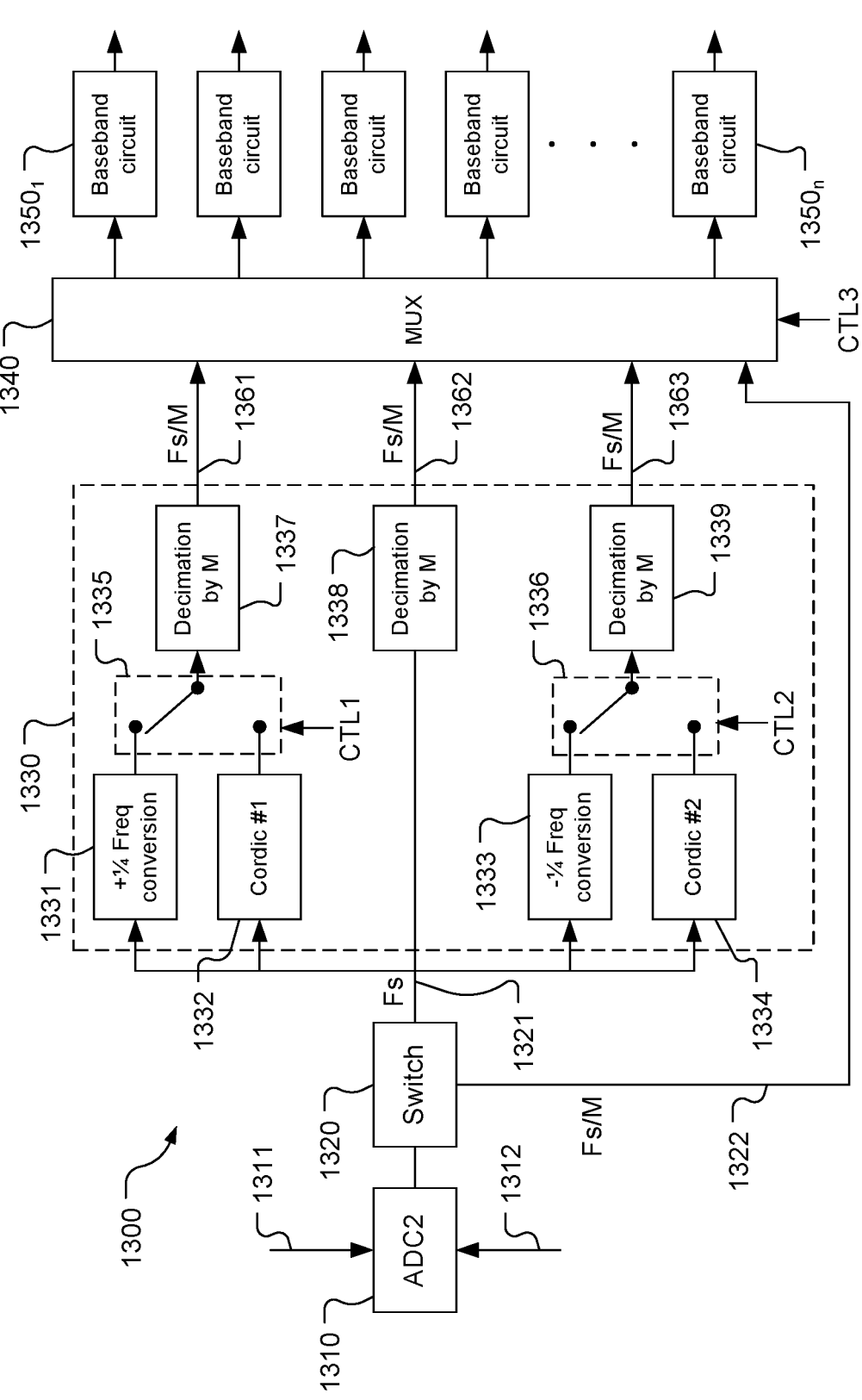
FIG. 13 is a block diagram of a portion of a positioning signal receiver.

Referring also to FIG. 13, an example portion 1300 of a receive chain of a positioning signal receiver includes an ADC 1310, a switch 1320, a pre-processing block 1330, a MUX 1340, and baseband circuits $1350_1$-$1350_n$. The pre-processing block 1330 may be an example of pre-processing blocks (including frequency converters, and filter and decimation circuits) shown in FIG. 12, and the baseband circuits $1350_1$-$1350_n$ may each include a frequency converter and a variable re-sampler (not shown). The ADC 1310 may be communicatively coupled and configured to receive an analog signal 1311 and a trigger signal 1312 of a selectable trigger frequency to cause the ADC 1310 to sample the analog signal 1311 at a sampling frequency of the trigger frequency, e.g., a sampling frequency of Fs (in a first mode) or Fs/M (in a second mode). The switch 1320 is communicatively coupled to the ADC 1310 and configured to selectively provide a digital signal output by the ADC 1310 to either the pre-processing block 1330 (in the first mode) or to the MUX 1340 (in the second mode) while bypassing the pre-processing block 1330. The switch 1320 may provide a digital signal 1321 to the pre-processing block 1330 in the first mode with the digital signal 1321 having a sampling frequency of Fs, and provide a digital signal 1322 to the MUX 1340 in the second mode with the digital signal having a sampling frequency of Fs/M.

In the example portion 1300, the pre-processing block 1330 includes a +¼ frequency conversion circuit 1331, a first cordic frequency conversion circuit 1332, a −¼ frequency conversion circuit 1333, and a second cordic frequency conversion circuit 1334. The ¼ frequency conversion circuits 1331, 1333 are configured to provide frequency shifts of ¼ of the clock frequency Fs. For example, a local oscillator frequency of 1220 MHz, an ADC sampling rate of 160 MHz, and a GPS L5 RF signal between 1166-1186 MHz may be used, with the GPS L5 signal at baseband being between-54 MHz and −34 MHz. Without frequency conversion, most of the baseband signal bandwidth is outside of the +/−40 MHz Nyquist band (with decimation of the sampling rate by ½ to 80 MHz). The baseband may be shifted by ¼ Fs, thus adding 160/4 MHz to the baseband frequency, making the baseband signal bandwidth-14 MHz to +6 MHz, which is well within the Nyquist band for 80 MHz sampling. The ¼ frequency conversion circuits 1331, 1333 may be implemented with less complex circuits than the cordic frequency conversion circuits 1332, 1334, thus saving power when either of the ¼ frequency conversion circuits 1331, 1333 are used compared to when either of the cordic frequency conversion circuits 1332, 1334 are used. For example, instead of complex computational math for a cordic frequency conversion, the ¼ frequency conversion circuits 1331, 1333 may use tables to determine values instead of computing math.

The pre-processing block 1330 includes switches 1335, 1336 coupled and configured to selectively couple a desired frequency conversion output to a decimation circuit. The switch 1335 may be configured to respond to a control signal CTL1 (e.g., from the controller 710) to selectively couple either the +¼ frequency conversion circuit 1331 or the first cordic frequency conversion circuit 1332 to a decimation circuit 1337. The switch 1335 may be configured to respond to a control signal CTL2 (e.g., from the controller 710) to selectively couple either the −¼ frequency conversion circuit 1333 or the second cordic frequency conversion circuit 1334 to a decimation circuit 1339. The switch 1320 may be coupled to a decimation circuit 1338 without going through a frequency conversion circuit. The decimation circuits 1337-1339 are configured to decimate an incoming signal by an integer value M, e.g., two (2). Thus, digital signals 1361, 1362, 1363, output by the decimation circuits 1337-1339 respectively, that may be provided to the MUX 1340 will have a sampling frequency that is the same as the sampling frequency of the digital signal 1322, here Fs/M. The MUX 1340 may be configured to selectively couple, e.g., in response to a control signal CTL3 (e.g., from the controller 710), any of the outputs of the pre-processing block 1330 or the switch 1320 (and thus route any of the digital signals 1361-1363 or the digital signal 1322) to any one of the baseband circuits 1350₁-1350ₙ.

Using the mobile device 600, e.g., the receivers 800, 1000, 1100, 1200, or the portion 1300 of a receiver, may provide various advantages. For example, less chip area and lower device cost may be realized for processing signals in a wide frequency range (e.g., including L5 and L6 bands compared to L5 band alone) compared to using separate receivers for different portions of the wide frequency band (e.g., one receiver for the L5 band and one receiver for the L6 band). Using the wide frequency band may improve positioning accuracy compared to processing signals from a smaller frequency band. Signals from the wide frequency band may be processed in a receiver that leverages a legacy design and legacy components, saving design and implementation cost, and conserving product cost.

Referring to FIG. 14, with further reference to FIGS. 1-13, a positioning signal processing method 1400 includes the stages shown. The method 1400 is, however, an example and not limiting. The method 1400 may be altered, e.g., by having one or more stages added, removed, rearranged, combined, performed concurrently, and/or having single stages split into multiple stages. Examples are provided below for receiving signals in the L1 band and in a frequency range including the L2, L5, and L6 bands, but the disclosure is not limited to these frequency bands, and is not limited to receiving (or measuring) satellite signals (also called SV signals).

At stage 1410, the method 1400 includes receiving, wirelessly at an apparatus, a first positioning signal in a first frequency range. For example, the receiver 610 may receive the first wireless positioning signal 601 and convert the first wireless positioning signal 601 into the first received signal 611. The receiver 610 (e.g., an antenna and possibly a front-end circuit) may comprise means for receiving the first positioning signal.

At stage 1420, the method 1400 includes receiving, wirelessly at the apparatus, a second positioning signal in a second frequency range. For example, the receiver 610 may receive the second wireless positioning signal 602 and convert the second wireless positioning signal 602 into the second received signal 612. The receiver 610 (e.g., an antenna and possibly a front-end circuit) may comprise means for receiving the second positioning signal.

At stage 1430, the method 1400 includes converting the first positioning signal by a first ADC of the apparatus to produce a first digital signal at a first sampling rate that is based on a clock signal. For example, the ADC 632 of the first receive chain 630 may convert the first received signal 611 into the first digital signal 634 by sampling the first received signal 611 at the first sampling frequency Fs1 that is based on the clock signal 621 from the clock 620. The ADC 632, possibly in combination with the clock 620, may comprise means for converting the first positioning signal to produce a first digital signal.

At stage 1440, the method 1400 includes converting the second positioning signal by a second ADC of the apparatus to produce a second digital signal at a second sampling rate that is based on the clock signal and that is different from, and related to, the first sampling rate. For example, the ADC 642 of the second receive chain 640 may convert the second received signal 612 into the second digital signal 644 by sampling the second received signal 612 at the second sampling frequency $F_{s2}$ that is based on the clock signal 621 from the clock 620 and that is different from, but related to, the first sampling frequency Fs1. For example, an integer i times the first sampling frequency Fs1 may be equal to an integer j times the second sampling frequency Fs2 (i.e., i*Fs1=j*Fs2). The ADC 642, possibly in combination with the clock 620, may comprise means for converting the second positioning signal to produce a second digital signal.

Implementations of the method 1400 may include one or more of the following features. In an example implementation, the method 1400 includes adjusting at least one of the first digital signal and the second digital signal to provide synchronized digital signals. For example, the sampling rate of the first digital signal and/or the sampling rate of the second digital signal may be changed such that the first digital signal and the second digital signal have similar (e.g., the same) sampling rate. For example, the sampling rate of the second digital signal may be adjusted by a fixed M/N re-sampler such as the re-sampler 872₁ as shown in FIG. 8. As another example, the sampling rate of the first digital signal may be adjusted by the decimation circuit 1010 (e.g., to decimate by N) and the sampling rate of the second digital signal may be adjusted by the decimation circuit 1020 (e.g., to decimate by M). As other examples, the sampling rate of the second digital signal may be adjusted by decimation circuits shown in FIG. 11 or FIG. 12. One or more re-samplers and/or one or more decimation circuits may comprise means for adjusting at least one of the first digital signal and the second digital signal to provide synchronized digital signals (which may have zero offset between the synchronized signals, or may have a fixed (constant), non-zero offset between the synchronized signals). In another example implementation, the method 1400 includes sampling the second digital signal, wherein the first digital signal will be synchronized with the second digital signal downstream from the re-sampling of the second digital signal. For example, the first digital signal 822 (before or after frequency conversion by any of the frequency converters $831_1$-$831_K$) will be synchronized with the second digital signal 862 after re-sampling by any of the re-samplers $872_1$-$872_L$. This may help improve time of arrival measurement accuracy between receive chains without incurring the expense and complexity of synchronizing signals sampled triggering from signal provided by separate clocks (e.g., on separate integrated circuit chips). One or more re-samplers such as one or more of the re-samplers $872_1$-$872_L$ may comprise means for re-sampling the second digital signal. In another example implementation, the first sampling rate is 1/M times a frequency of the clock signal, wherein M is an integer, wherein the second sampling rate is 1/N times the frequency of the clock signal, wherein N is an integer, and wherein the method further comprises sampling the second digital signal at a rate of M/N times the first sampling rate. For example, as shown in FIG. 8, the first ADC 820 may be triggered by a sampling frequency 1/M times the frequency of the clock signal (e.g., as provided by the first frequency divider 810) and the second ADC 860 may be triggered by a sampling frequency 1/N times the frequency of the clock signal (e.g., as provided by the second frequency divider 850), and the second digital signal is re-sampled by one or more of the re-samplers $872_1$-$872_L$. One or more of the re-samplers $872_1$-$872_L$ may comprise means for sampling the second digital signal at a rate of M/N times the first sampling rate. In another example implementation, the first sampling rate is 1/M times a frequency of the clock signal, wherein M is an integer, wherein the second sampling rate is 1/N times the frequency of the clock signal, wherein N is an integer, and wherein the method 1400 further includes: decimating the first digital signal by a factor of N; and decimating the first digital signal by a factor of M. For example, as shown in FIG. 10, the first ADC may be triggered by a sampling frequency 1/M times the frequency of the clock signal (e.g., as provided by the first frequency divider 810) and the second ADC 860 may be triggered by a sampling frequency 1/N times the frequency of the clock signal (e.g., as provided by the second frequency divider 850), the first digital signal may be decimated by one or more decimate-by-N circuits (e.g., a decimation portion of the filter and decimation circuit 1010), and the second digital signal may be decimated by one or more decimate-by-M circuits (e.g., a decimation portion of the filter and decimation circuit 1020). The decimation portions of the circuits 1010, 1020 may comprise means for decimating the first digital signal by a factor of N and decimating the second digital signal by a factor of M, respectively.

Also or alternatively, implementations of the method 1400 may include one or more of the following features. In an example implementation, the method 1400 includes determining a position estimate of the apparatus based on a relationship between the first sampling rate and the second sampling rate, wherein: the first sampling rate is 1/M times a frequency of the clock signal, wherein M is an integer; the second sampling rate is 1/N times the frequency of the clock signal, wherein N is an integer; the first ADC is configured to sample the first positioning signal at first sample times comprising a first set of first sample times and a second set of first sample times; the second ADC is configured to sample the second positioning signal at second sample times comprising a first set of second sample times and a second set of second sample times; the first set of first sample times and the first set of second sample times both correspond to a first set of L cycles of the clock signal, L being a least common denominator of 1/M and 1/N; the second set of first sample times and the second set of second sample times both correspond to a second set of L cycles of the clock signal; and an $i^{th}$ one of the first sample times of the first set of first sample times and an $i^{th}$ one of the first sample times of the second set of first sample times have substantially a same sampling time difference relative to a $j^{th}$ one of the second sample times of the first set of second sample times and a $j^{th}$ one of the second sample times of the second set of second sample times, respectively. For example, the processor 510 may determine a position estimate for the mobile device 500 based on a timing relationship or a phase relationship of samples of signals, e.g., the digital signals 634, 644. The processor 510, possibly in combination with the memory 530, in combination with the receive chains 630, 640, may comprise means for determining a position estimate of the apparatus. In a further example implementation, determining the position estimate of the apparatus comprises determining the position estimate of the apparatus based on a difference between the first sampling rate and the second sampling rate.

Also or alternatively, implementations of the method 1400 may include one or more of the following features. In an example implementation, the method 1400 includes: receiving, wirelessly at the apparatus, a third positioning signal in the second frequency range; and converting the third positioning signal by the second ADC of the apparatus to produce a third digital signal at the first sampling rate. For example, the receiver 610 may receive a third wireless signal (e.g., the second wireless signal 602 at a different time than when converted to a digital signal using the second sampling rate) and convert the third wireless signal into a third received signal. The receiver 610 (e.g., an antenna and possibly a front-end circuit) may comprise means for receiving and converting the third wireless positioning signal into the third received signal. Also, as shown in FIG. 11, a third received signal may be converted into a digital signal by the ADC 1130 at the same sampling rate used to trigger the ADC 1160 as provided by the switch 1120. The frequency divider 1110, the switch 1120 (possibly in conjunction with a controller such as the controller 710), and the ADC 1130 (possibly in combination with a clock) may comprise means for converting the third received signal into the third digital signal. In a further example implementation, the method further includes at least one of: applying a first decimation to the second digital signal; or bypassing the first decimation for the third digital signal. For example, as shown in FIG. 12, when an analog signal is sampled at the second sampling rate, the second digital signal may be provided by the switch 1135 to a decimator, e.g., a decimation portion of a baseband pre-processing circuit $1240_1$ that may decimate the second digital signal, and when the analog signal is sampled at the first sampling rate to produce the third digital signal, the third digital signal may be provided by the switch 1135 to the MUX 1210 while bypassing the decimator of the baseband pre-processing circuit $1240_1$. In another further example implementation, the method includes selectively processing the second digital signal by one of a plurality of baseband processing circuits. For example, as shown in FIG. 13, the second digital signal, e.g., any of the digital signals 1361-1363, may be provided by the MUX 1340 (e.g., based on a control signal from a controller) to a selected one of the baseband circuits $1350_1$-$1350_n$. The MUX 1340, possibly in combination with a controller (e.g., the controller 710), in combination with one of the baseband circuits $1350_1$-$1350_n$ may comprise means for selectively processing the second digital signal. In another further example implementation, the method includes adjusting a frequency of the second digital signal by one-fourth of a reference frequency to produce a quarter-converted signal. For example, the digital signal 1321 may be +¼ frequency converted by the +¼ frequency conversion circuit 1331, and/or may be −¼ frequency converted by the −¼ frequency conversion circuit 1333, and have an output of the +¼ frequency conversion circuit 1331 decimated by the decimation circuit 1337 as selected by the switch 1335 based on the control signal CTL1, or have an output of the −¼ frequency conversion circuit 1333 decimated by the decimation circuit 1338 as selected by the switch 1336 based on the control signal CTL2. The +¼ frequency conversion circuit 1331 and/or the −¼ frequency conversion circuit 1333 may comprise means for adjusting the frequency of the second digital signal by one-fourth of a reference frequency. In another further example implementation, the method includes: adjusting a frequency of the second digital signal by one-fourth of a reference frequency to produce a quarter-converted signal; applying a cordic to the second digital signal to produce a cordic-converted signal; and selectively decimating either the quarter-converted signal or the cordic-converted signal. For example, the adjusting may be up or down by one-quarter of a reference frequency, e.g., the digital signal 1321 may be +¼ frequency converted by the +¼ frequency conversion circuit 1331 and have a cordic applied by the first cordic frequency conversion circuit 1332, and/or may be −¼ frequency converted by the −¼ frequency conversion circuit 1333 and have a cordic applied by the second cordic frequency conversion circuit 1334, and have an output of the +¼ frequency conversion circuit 1331 or an output of the first cordic frequency conversion circuit 1332 decimated by the decimation circuit 1337 as selected by the switch 1335 based on the control signal CTL1, or have an output of the −¼ frequency conversion circuit 1333 or an output of the second cordic frequency conversion circuit 1334 decimated by the decimation circuit 1338 as selected by the switch 1336 based on the control signal CTL2. An apparatus may have first and second receive chains, and the second receive chain may include a pre-processing circuit and a baseband processing circuit. The pre-processing circuit may include a first frequency converter and a second frequency converter (i.e., may include two or more frequency converters), e.g., the frequency conversion circuits 1331, 1332 or the frequency conversion circuits 1333, 1334, with the first frequency converter (e.g., the frequency conversion circuit 1331 or the frequency conversion circuit 1333) configured to adjust a frequency of an input signal (e.g., up or down) by one-fourth of a reference frequency. The +¼ frequency conversion circuit 1331 and/or the −¼ frequency conversion circuit 1333 may comprise means for adjusting the frequency of the second digital signal by one-fourth of a reference frequency. The first cordic frequency conversion circuit 1332 and/or the second cordic frequency conversion circuit 1334 may comprise means for applying a cordic to the second digital signal. The switch 1335 and/or the switch 1336, possibly in combination with a controller such as the controller 710, and the decimation circuit 1337 and/or the decimation circuit 1338 may comprise means for selectively decimating either the quarter-converted signal or the cordic-converted signal.

Also or alternatively, implementations of the method 1400 may include one or more of the following features. In an example implementation, a first integer multiple of the first sampling rate equals a second integer multiple of the second sampling rate.

Implementation Examples

Implementation examples are provided in the following numbered clauses.

Clause 1. An apparatus comprising:
a receiver configured to obtain, wirelessly, a first positioning signal in a first frequency range, and configured to obtain, wirelessly, a second positioning signal in a second frequency range;
a clock configured to provide a clock signal;
a first receive chain, communicatively coupled to the clock and to the receiver, comprising a first analog-to-digital converter (ADC) and configured to cause the first ADC to produce a first digital signal, based on the first positioning signal, at a first sampling rate that is based on the clock signal; and
a second receive chain, communicatively coupled to the clock and to the receiver, comprising a second ADC and configured to cause the second ADC to produce a second digital signal, based on the second positioning signal, at a second sampling rate that is based on the clock signal and that is different from, and related to, the first sampling rate.

Clause 2. The apparatus of clause 1, wherein the first receive chain and the second receive chain are configured to provide synchronized digital signals.

Clause 3. The apparatus of clause 1, wherein the second receive chain comprises a sampling adjustment circuit communicatively coupled to an output of the second ADC and configured to sample the second digital signal such that a first reference signal in the first receive chain downstream from the first ADC will be synchronized with a second reference signal in the second receive chain downstream from the sampling adjustment circuit.

Clause 4. The apparatus of clause 1, wherein the first sampling rate is 1/M times a frequency of the clock signal, wherein M is an integer, wherein the second sampling rate is 1/N times the frequency of the clock signal, wherein N is an integer, and wherein the second receive chain comprises a sampling circuit communicatively coupled to an output of the second ADC and configured to sample an input signal received by the sampling circuit at a rate of M/N times the first sampling rate.

Clause 5. The apparatus of clause 1, wherein the first sampling rate is 1/M times a frequency of the clock signal, wherein M is an integer, wherein the second sampling rate is 1/N times the frequency of the clock signal, wherein N is an integer, wherein the first receive chain comprises a first decimator communicatively coupled to a first output of the first ADC and configured to decimate a first input signal received by the first decimator by a factor of N, and wherein the second receive chain comprises a second decimator communicatively coupled to a second output of the second ADC and configured to decimate a second input signal received by the second decimator by a factor of M.

Clause 6. The apparatus of clause 1, further comprising a processor communicatively coupled to the first receive chain and the second receive chain, and configured to determine a position estimate of the apparatus based on a relationship between the first sampling rate and the second sampling rate, wherein:

the first sampling rate is 1/M times a frequency of the clock signal, wherein M is an integer;

the second sampling rate is 1/N times the frequency of the clock signal, wherein N is an integer;

the first ADC is configured to sample the first positioning signal at first sample times comprising a first set of first sample times and a second set of first sample times;

the second ADC is configured to sample the second positioning signal at second sample times comprising a first set of second sample times and a second set of second sample times;

the first set of first sample times and the first set of second sample times both correspond to a first set of L cycles of the clock signal, L being a least common denominator of 1/M and 1/N;

the second set of first sample times and the second set of second sample times both correspond to a second set of L cycles of the clock signal; and an $i^{th}$ one of the first sample times of the first set of first sample times and an $i^{th}$ one of the first sample times of the second set of first sample times have substantially a same sampling time difference relative to a $j^{th}$ one of the second sample times of the first set of second sample times and a $j^{th}$ one of the second sample times of the second set of second sample times, respectively.

Clause 7. The apparatus of clause 6, wherein the processor is configured to determine the position estimate of the apparatus based on a difference between the first sampling rate and the second sampling rate.

Clause 8. The apparatus of clause 1, wherein the second receive chain is configured to selectively cause the second ADC to sample the second positioning signal at the second sampling rate or at the first sampling rate.

Clause 9. The apparatus of clause 8, wherein the second receive chain comprises a first frequency converter and a second frequency converter, and wherein the second receive chain is configured to communicatively couple the second frequency converter, while bypassing the first frequency converter, to an output of the second ADC corresponding to the second receive chain while causing the second ADC to sample the second positioning signal at the first sampling rate, and to communicatively couple the first frequency converter and the second frequency converter, in series, to the output of the second ADC corresponding to the second receive chain while causing the second ADC to sample the second positioning signal at the second sampling rate.

Clause 10. The apparatus of clause 8, wherein the second receive chain comprises one or more pre-processing circuits each comprising a respective pre-processing circuit frequency converter, the second receive chain comprises a plurality of baseband processing circuits each comprising a respective baseband processing circuit frequency converter, and the apparatus further comprises a multiplexer configured to selectively communicatively couple one of the plurality of baseband processing circuits to one of the one or more pre-processing circuits or to the second ADC while bypassing the one or more pre-processing circuits.

Clause 11. The apparatus of clause 8, wherein the second receive chain comprises a pre-processing circuit and a baseband processing circuit, the pre-processing circuit comprises a first frequency converter, a second frequency converter, and a decimator selectively coupled to one of the first frequency converter or the second frequency converter, and wherein the first frequency converter is configured to adjust a frequency of an input signal by one-fourth of a reference frequency.

Clause 12. The apparatus of clause 1, wherein a first integer multiple of the first sampling rate equals a second integer multiple of the second sampling rate.

Clause 13. A positioning signal processing method comprising:

receiving, wirelessly at an apparatus, a first positioning signal in a first frequency range;

receiving, wirelessly at the apparatus, a second positioning signal in a second frequency range;

converting the first positioning signal by a first analog-to-digital converter (ADC) of the apparatus to produce a first digital signal at a first sampling rate that is based on a clock signal; and converting the second positioning signal by a second ADC of the apparatus to produce a second digital signal at a second sampling rate that is based on the clock signal and that is different from, and related to, the first sampling rate.

Clause 14. The positioning signal processing method of clause 13, further comprising adjusting at least one of the first digital signal and the second digital signal to provide synchronized digital signals.

Clause 15. The positioning signal processing method of clause 13, further comprising sampling the second digital signal, wherein the first digital signal will be synchronized with the second digital signal downstream from the sampling of the second digital signal.

Clause 16. The positioning signal processing method of clause 13, wherein the first sampling rate is 1/M times a frequency of the clock signal, wherein M is an integer, wherein the second sampling rate is 1/N times the frequency of the clock signal, wherein N is an integer, and wherein the method further comprises sampling the second digital signal at a rate of M/N times the first sampling rate.

Clause 17. The positioning signal processing method of clause 13, wherein the first sampling rate is 1/M times a frequency of the clock signal, wherein M is an integer, wherein the second sampling rate is 1/N times the frequency of the clock signal, wherein N is an integer, and wherein the method further comprises:

decimating the first digital signal by a factor of N; and decimating the second digital signal by a factor of M.

Clause 18. The positioning signal processing method of clause 13, further comprising determining a position estimate of the apparatus based on a relationship between the first sampling rate and the second sampling rate, wherein:

the first sampling rate is 1/M times a frequency of the clock signal, wherein M is an integer;

the second sampling rate is 1/N times the frequency of the clock signal, wherein N is an integer;

the first ADC is configured to sample the first positioning signal at first sample times comprising a first set of first sample times and a second set of first sample times;

the second ADC is configured to sample the second positioning signal at second sample times comprising a first set of second sample times and a second set of second sample times;

the first set of first sample times and the first set of second sample times both correspond to a first set of L cycles of the clock signal, L being a least common denominator of 1/M and 1/N;

the second set of first sample times and the second set of second sample times both correspond to a second set of L cycles of the clock signal; and an $i^{th}$ one of the first sample times of the first set of first sample times and an $i^{th}$ one of the first sample times of the second set of first sample times have substantially a same sampling time difference relative to a j$^{th}$ one of the second sample times of the first set of second sample times and a j$^{th}$ one of the second sample times of the second set of second sample times, respectively.

Clause 19. The positioning signal processing method of clause 18, wherein determining the position estimate of the apparatus comprises determining the position estimate of the apparatus based on a difference between the first sampling rate and the second sampling rate.

Clause 20. The positioning signal processing method of clause 13, further comprising:

receiving, wirelessly at the apparatus, a third positioning signal in the second frequency range; and converting the third positioning signal by the second ADC of the apparatus to a third digital signal at the first sampling rate.

Clause 21. The positioning signal processing method of clause 18, further comprising at least one of:

applying a first decimation to the second digital signal; or bypassing the first decimation for the third digital signal.

Clause 22. The positioning signal processing method of clause 18, further comprising selectively processing the second digital signal by one of a plurality of baseband processing circuits.

Clause 23. The positioning signal processing method of clause 18, further comprising: adjusting a frequency of the second digital signal by one-fourth of a reference frequency to produce a quarter-converted signal.

Clause 24. The positioning signal processing method of clause 13, wherein a first integer multiple of the first sampling rate equals a second integer multiple of the second sampling rate.

Clause 25. An apparatus comprising:

means for receiving, wirelessly, a first positioning signal in a first frequency range;

means for receiving, wirelessly, a second positioning signal in a second frequency range;

means for converting the first positioning signal by a first analog-to-digital converter (ADC) of the apparatus to produce a first digital signal at a first sampling rate that is based on a clock signal; and means for converting the second positioning signal by a second ADC of the apparatus to produce a second digital signal at a second sampling rate that is based on the clock signal and that is different from, and related to, the first sampling rate.

Clause 26. The apparatus of clause 25, further comprising means for adjusting at least one of the first digital signal and the second digital signal to provide synchronized digital signals.

Clause 27. The apparatus of clause 25, further comprising means for sampling the second digital signal, wherein the first digital signal will be synchronized with the second digital signal downstream from the means for sampling the second digital signal.

Clause 28. The apparatus of clause 25, wherein the first sampling rate is 1/M times a frequency of the clock signal, wherein M is an integer, wherein the second sampling rate is 1/N times the frequency of the clock signal, wherein N is an integer, and wherein the apparatus further comprises means for sampling the second digital signal at a rate of M/N times the first sampling rate.

Clause 29. The apparatus of clause 25, wherein the first sampling rate is 1/M times a frequency of the clock signal, wherein M is an integer, wherein the second sampling rate is 1/N times the frequency of the clock signal, wherein N is an integer, and wherein the apparatus further comprises:

means for decimating the first digital signal by a factor of N; and means for decimating the second digital signal by a factor of M.

Clause 30. The apparatus of clause 25, further comprising means for determining a position estimate of the apparatus based on a relationship between the first sampling rate and the second sampling rate, wherein:

the first sampling rate is 1/M times a frequency of the clock signal, wherein M is an integer;

the second sampling rate is 1/N times the frequency of the clock signal, wherein N is an integer;

the first ADC is configured to sample the first positioning signal at first sample times comprising a first set of first sample times and a second set of first sample times;

the second ADC is configured to sample the second positioning signal at second sample times comprising a first set of second sample times and a second set of second sample times;

the first set of first sample times and the first set of second sample times both correspond to a first set of L cycles of the clock signal, L being a least common denominator of 1/M and 1/N;

the second set of first sample times and the second set of second sample times both correspond to a second set of L cycles of the clock signal; and an i$^{th}$ one of the first sample times of the first set of first sample times and an i$^{th}$ one of the first sample times of the second set of first sample times have substantially a same sampling time difference relative to a j$^{th}$ one of the second sample times of the first set of second sample times and a j$^{th}$ one of the second sample times of the second set of second sample times, respectively.

Clause 31. The apparatus of clause 30, wherein the means for determining the position estimate of the apparatus comprise means for determining the position estimate of the apparatus based on a difference between the first sampling rate and the second sampling rate.

Clause 32. The apparatus of clause 25, further comprising:

means for receiving, wirelessly, a third positioning signal in the second frequency range; and means for converting the third positioning signal by the second ADC of the apparatus to produce a third digital signal at the first sampling rate.

Clause 33. The apparatus of clause 32, further comprising:

means for applying a first decimation to the second digital signal; and means for bypassing the first decimation for the third digital signal.

Clause 34. The apparatus of clause 32, further comprising means for selectively processing the second digital signal by one of a plurality of baseband processing circuits.

Clause 35. The apparatus of clause 32, further comprising means for adjusting a frequency of the second digital signal by one-fourth of a reference frequency to produce a quarter-converted signal.

Clause 36. The apparatus of clause 25, wherein a first integer multiple of the first sampling rate equals a second integer multiple of the second sampling rate.

Other Considerations

Other examples and implementations are within the scope of the disclosure and appended claims. For example, due to the nature of software and computers, functions described above can be implemented using software executed by a processor, hardware, firmware, hardwiring, or a combination of any of these. Features implementing functions may also be physically located at various positions, including being distributed such that portions of functions are implemented at different physical locations.

As used herein, the singular forms "a," "an," and "the" include the plural forms as well, unless the context clearly indicates otherwise. The terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

As used herein, the term RS (reference signal) may refer to one or more reference signals and may apply, as appropriate, to any form of the term RS, e.g., PRS, SRS, CSI-RS, etc.

As used herein, unless otherwise stated, a statement that a function or operation is "based on" an item or condition means that the function or operation is based on the stated item or condition and may be based on one or more items and/or conditions in addition to the stated item or condition.

Also, as used herein, "or" as used in a list of items (possibly prefaced by "at least one of" or prefaced by "one or more of") indicates a disjunctive list such that, for example, a list of "at least one of A, B, or C," or a list of "one or more of A, B, or C" or a list of "A or B or C" means A, or B, or C, or AB (A and B), or AC (A and C), or BC (B and C), or ABC (i.e., A and B and C), or combinations with more than one feature (e.g., AA, AAB, ABBC, etc.). Thus, a recitation that an item, e.g., a processor, is configured to perform a function regarding at least one of A or B, or a recitation that an item is configured to perform a function A or a function B, means that the item may be configured to perform the function regarding A, or may be configured to perform the function regarding B, or may be configured to perform the function regarding A and B. For example, a phrase of "a processor configured to measure at least one of A or B" or "a processor configured to measure A or measure B" means that the processor may be configured to measure A (and may or may not be configured to measure B), or may be configured to measure B (and may or may not be configured to measure A), or may be configured to measure A and measure B (and may be configured to select which, or both, of A and B to measure). Similarly, a recitation of a means for measuring at least one of A or B includes means for measuring A (which may or may not be able to measure B), or means for measuring B (and may or may not be configured to measure A), or means for measuring A and B (which may be able to select which, or both, of A and B to measure). As another example, a recitation that an item, e.g., a processor, is configured to at least one of perform function X or perform function Y means that the item may be configured to perform the function X, or may be configured to perform the function Y, or may be configured to perform the function X and to perform the function Y. For example, a phrase of "a processor configured to at least one of measure X or measure Y" means that the processor may be configured to measure X (and may or may not be configured to measure Y), or may be configured to measure Y (and may or may not be configured to measure X), or may be configured to measure X and to measure Y (and may be configured to select which, or both, of X and Y to measure).

Substantial variations may be made in accordance with specific requirements. For example, customized hardware might also be used, and/or particular elements might be implemented in hardware, software (including portable software, such as applets, etc.) executed by a processor, or both. Further, connection to other computing devices such as network input/output devices may be employed. Components, functional or otherwise, shown in the figures and/or discussed herein as being connected or communicating with each other are communicatively coupled unless otherwise noted. That is, they may be directly or indirectly connected to enable communication between them.

The systems and devices discussed above are examples. Various configurations may omit, substitute, or add various procedures or components as appropriate. For instance, features described with respect to certain configurations may be combined in various other configurations. Different aspects and elements of the configurations may be combined in a similar manner. Also, technology evolves and, thus, many of the elements are examples and do not limit the scope of the disclosure or claims.

A wireless communication system is one in which communications are conveyed wirelessly, i.e., by electromagnetic and/or acoustic waves propagating through atmospheric space rather than through a wire or other physical connection, between wireless communication devices. A wireless communication system (also called a wireless communications system, a wireless communication network, or a wireless communications network) may not have all communications transmitted wirelessly, but is configured to have at least some communications transmitted wirelessly. Further, the term "wireless communication device," or similar term, does not require that the functionality of the device is exclusively, or even primarily, for communication, or that communication using the wireless communication device is exclusively, or even primarily, wireless, or that the device be a mobile device, but indicates that the device includes wireless communication capability (one-way or two-way), e.g., includes at least one radio (each radio being part of a transmitter, receiver, or transceiver) for wireless communication.

Specific details are given in the description herein to provide a thorough understanding of example configurations (including implementations). However, configurations may be practiced without these specific details. For example, well-known circuits, processes, algorithms, structures, and techniques have been shown without unnecessary detail in order to avoid obscuring the configurations. The description herein provides example configurations, and does not limit the scope, applicability, or configurations of the claims. Rather, the preceding description of the configurations provides a description for implementing described techniques. Various changes may be made in the function and arrangement of elements.

The terms "processor-readable medium," "machine-readable medium," and "computer-readable medium," as used herein, refer to any medium that participates in providing data that causes a machine to operate in a specific fashion. Using a computing platform, various processor-readable media might be involved in providing instructions/code to processor(s) for execution and/or might be used to store and/or carry such instructions/code (e.g., as signals). In many implementations, a processor-readable medium is a physical and/or tangible storage medium. Such a medium may take many forms, including but not limited to, non-volatile media and volatile media. Non-volatile media include, for example, optical and/or magnetic disks. Volatile media include, without limitation, dynamic memory.

Having described several example configurations, various modifications, alternative constructions, and equivalents may be used. For example, the above elements may be components of a larger system, wherein other rules may take precedence over or otherwise modify the application of the disclosure. Also, a number of operations may be undertaken before, during, or after the above elements are considered. Accordingly, the above description does not bound the scope of the claims.

Unless otherwise indicated, "about" and/or "approximately" as used herein when referring to a measurable value such as an amount, a temporal duration, and the like, encompasses variations of ±20% or ±10%, ±5%, or ±0.1% from the specified value, as appropriate in the context of the systems, devices, circuits, methods, and other implementations described herein. Unless otherwise indicated, "substantially" as used herein when referring to a measurable value such as an amount, a temporal duration, a physical attribute (such as frequency), and the like, also encompasses variations of ±20% or ±10%, ±5%, or ±0.1% from the specified value, as appropriate in the context of the systems, devices, circuits, methods, and other implementations described herein.

A statement that a value exceeds (or is more than or above) a first threshold value is equivalent to a statement that the value meets or exceeds a second threshold value that is slightly greater than the first threshold value, e.g., the second threshold value being one value higher than the first threshold value in the resolution of a computing system. A statement that a value is less than (or is within or below) a first threshold value is equivalent to a statement that the value is less than or equal to a second threshold value that is slightly lower than the first threshold value, e.g., the second threshold value being one value lower than the first threshold value in the resolution of a computing system.

The invention claimed is:

1. An apparatus comprising:
a receiver configured to obtain, wirelessly, a first positioning signal in a first frequency range, and configured to obtain, wirelessly, a second positioning signal in a second frequency range;
a clock configured to provide a clock signal;
a first receive chain, communicatively coupled to the clock and to the receiver, comprising a first analog-to-digital converter (ADC) and configured to cause the first ADC to produce a first digital signal, based on the first positioning signal, at a first sampling rate that is based on the clock signal; and
a second receive chain, communicatively coupled to the clock and to the receiver, comprising a second ADC and configured to cause the second ADC to produce a second digital signal, based on the second positioning signal, at a second sampling rate that is based on the clock signal and that is different from, and related to, the first sampling rate; and
wherein the first receive chain and the second receive chain are configured to provide synchronized digital signals.

2. The apparatus of claim 1, wherein the second receive chain comprises a sampling adjustment circuit communicatively coupled to an output of the second ADC and configured to sample the second digital signal such that a first reference signal in the first receive chain downstream from the first ADC will be synchronized with a second reference signal in the second receive chain downstream from the sampling adjustment circuit.

3. The apparatus of claim 1, wherein the first sampling rate is 1/M times a frequency of the clock signal, wherein M is a non-zero integer, wherein the second sampling rate is 1/N times the frequency of the clock signal, wherein N is a non-zero integer, and wherein the second receive chain comprises a sampling circuit communicatively coupled to an output of the second ADC and configured to sample an input signal received by the sampling circuit at a rate of M/N times the first sampling rate.

4. The apparatus of claim 1, wherein the first sampling rate is 1/M times a frequency of the clock signal, wherein M is a non-zero integer, wherein the second sampling rate is 1/N times the frequency of the clock signal, wherein N is a non-zero integer, wherein the first receive chain comprises a first decimator communicatively coupled to a first output of the first ADC and configured to decimate a first input signal received by the first decimator by a factor of N, and wherein the second receive chain comprises a second decimator communicatively coupled to a second output of the second ADC and configured to decimate a second input signal received by the second decimator by a factor of M.

5. The apparatus of claim 1, further comprising a processor communicatively coupled to the first receive chain and the second receive chain, and configured to determine a position estimate of the apparatus based on a relationship between the first sampling rate and the second sampling rate, wherein:
the first sampling rate is 1/M times a frequency of the clock signal, wherein M is a non-zero integer;
the second sampling rate is 1/N times the frequency of the clock signal, wherein N is a non-zero integer;
the first ADC is configured to sample the first positioning signal at first sample times comprising a first set of first sample times and a second set of first sample times;
the second ADC is configured to sample the second positioning signal at second sample times comprising a first set of second sample times and a second set of second sample times;
the first set of first sample times and the first set of second sample times both correspond to a first set of L cycles of the clock signal, L being a least common denominator of 1/M and 1/N;
the second set of first sample times and the second set of second sample times both correspond to a second set of L cycles of the clock signal; and
an $i^{th}$ one of the first sample times of the first set of first sample times and an $i^{th}$ one of the first sample times of the second set of first sample times have substantially a same sampling time difference relative to a $j^{th}$ one of the second sample times of the first set of second sample times and a $j^{th}$ one of the second sample times of the second set of second sample times, respectively.

6. The apparatus of claim 5, wherein the processor is configured to determine the position estimate of the apparatus based on a difference between the first sampling rate and the second sampling rate.

7. The apparatus of claim 1, wherein the second receive chain is configured to selectively cause the second ADC to sample the second positioning signal at the second sampling rate or at the first sampling rate.

8. The apparatus of claim 7, wherein the second receive chain comprises a first frequency converter and a second frequency converter, and wherein the second receive chain is configured to communicatively couple the second frequency converter, while bypassing the first frequency converter, to an output of the second ADC corresponding to the second receive chain while causing the second ADC to sample the second positioning signal at the first sampling rate, and to communicatively couple the first frequency converter and the second frequency converter, in series, to the output of the second ADC corresponding to the second receive chain while causing the second ADC to sample the second positioning signal at the second sampling rate.

9. The apparatus of claim 7, wherein the second receive chain comprises one or more pre-processing circuits each comprising a respective pre-processing circuit frequency converter, the second receive chain comprises a plurality of baseband processing circuits each comprising a respective baseband processing circuit frequency converter, and the apparatus further comprises a multiplexer configured to selectively communicatively couple one of the plurality of baseband processing circuits to one of the one or more pre-processing circuits or to the second ADC while bypassing the one or more pre-processing circuits.

10. The apparatus of claim 7, wherein the second receive chain comprises a pre-processing circuit and a baseband processing circuit, the pre-processing circuit comprises a first frequency converter, a second frequency converter, and a decimator selectively coupled to one of the first frequency converter or the second frequency converter, and wherein the first frequency converter is configured to adjust a frequency of an input signal by one-fourth of a reference frequency.

11. The apparatus of claim 1, wherein a first integer multiple of the first sampling rate equals a second integer multiple of the second sampling rate.

12. A positioning signal processing method comprising:
receiving, wirelessly at an apparatus, a first positioning signal in a first frequency range;
receiving, wirelessly at the apparatus, a second positioning signal in a second frequency range;
converting the first positioning signal by a first analog-to-digital converter (ADC) of the apparatus to produce a first digital signal at a first sampling rate that is based on a clock signal;
converting the second positioning signal by a second ADC of the apparatus to produce a second digital signal at a second sampling rate that is based on the clock signal and that is different from, and related to, the first sampling rate; and
adjusting at least one of the first digital signal and the second digital signal to provide synchronized digital signals.

13. The positioning signal processing method of claim 12, further comprising sampling the second digital signal, wherein the first digital signal will be synchronized with the second digital signal downstream from the sampling of the second digital signal.

14. The positioning signal processing method of claim 12, wherein the first sampling rate is 1/M times a frequency of the clock signal, wherein M is a non-zero integer, wherein the second sampling rate is 1/N times the frequency of the clock signal, wherein N is a non-zero integer, and wherein the method further comprises sampling the second digital signal at a rate of M/N times the first sampling rate.

15. The positioning signal processing method of claim 12, wherein the first sampling rate is 1/M times a frequency of the clock signal, wherein M is a non-zero integer, wherein the second sampling rate is 1/N times the frequency of the clock signal, wherein N is a non-zero integer, and wherein the method further comprises:
decimating the first digital signal by a factor of N; and
decimating the second digital signal by a factor of M.

16. The positioning signal processing method of claim 12, further comprising determining a position estimate of the apparatus based on a relationship between the first sampling rate and the second sampling rate, wherein:

the first sampling rate is 1/M times a frequency of the clock signal, wherein M is a non-zero integer;
the second sampling rate is 1/N times the frequency of the clock signal, wherein N is a non-zero integer;
the first ADC is configured to sample the first positioning signal at first sample times comprising a first set of first sample times and a second set of first sample times;
the second ADC is configured to sample the second positioning signal at second sample times comprising a first set of second sample times and a second set of second sample times;
the first set of first sample times and the first set of second sample times both correspond to a first set of L cycles of the clock signal, L being a least common denominator of 1/M and 1/N;
the second set of first sample times and the second set of second sample times both correspond to a second set of L cycles of the clock signal; and
an $i^{th}$ one of the first sample times of the first set of first sample times and an $i^{th}$ one of the first sample times of the second set of first sample times have substantially a same sampling time difference relative to a $j^{th}$ one of the second sample times of the first set of second sample times and a $j^{th}$ one of the second sample times of the second set of second sample times, respectively.

17. The positioning signal processing method of claim 16, wherein determining the position estimate of the apparatus comprises determining the position estimate of the apparatus based on a difference between the first sampling rate and the second sampling rate.

18. The positioning signal processing method of claim 12, further comprising:
receiving, wirelessly at the apparatus, a third positioning signal in the second frequency range; and
converting the third positioning signal by the second ADC of the apparatus to a third digital signal at the first sampling rate.

19. The positioning signal processing method of claim 18, further comprising at least one of:
applying a first decimation to the second digital signal; or
bypassing the first decimation for the third digital signal.

20. The positioning signal processing method of claim 18, further comprising selectively processing the second digital signal by one of a plurality of baseband processing circuits.

21. The positioning signal processing method of claim 18, further comprising: adjusting a frequency of the second digital signal by one-fourth of a reference frequency to produce a quarter-converted signal.

22. The positioning signal processing method of claim 12, wherein a first integer multiple of the first sampling rate equals a second integer multiple of the second sampling rate.

23. An apparatus comprising:
means for receiving, wirelessly, a first positioning signal in a first frequency range;
means for receiving, wirelessly, a second positioning signal in a second frequency range;
means for converting the first positioning signal by a first analog-to-digital converter (ADC) of the apparatus to produce a first digital signal at a first sampling rate that is based on a clock signal;
means for converting the second positioning signal by a second ADC of the apparatus to produce a second digital signal at a second sampling rate that is based on the clock signal and that is different from, and related to, the first sampling rate; and means for adjusting at least one of the first digital signal and the second digital signal to provide synchronized digital signals.

24. The apparatus of claim 23, further comprising means for sampling the second digital signal, wherein the first digital signal will be synchronized with the second digital signal downstream from the means for sampling the second digital signal.

25. The apparatus of claim 23, wherein the first sampling rate is 1/M times a frequency of the clock signal, wherein M is a non-zero integer, wherein the second sampling rate is 1/N times the frequency of the clock signal, wherein N is a non-zero integer, and wherein the apparatus further comprises means for sampling the second digital signal at a rate of M/N times the first sampling rate.

26. The apparatus of claim 23, wherein the first sampling rate is 1/M times a frequency of the clock signal, wherein M is a non-zero integer, wherein the second sampling rate is 1/N times the frequency of the clock signal, wherein N is a non-zero integer, and wherein the apparatus further comprises:

means for decimating the first digital signal by a factor of N; and means for decimating the second digital signal by a factor of M.

27. The apparatus of claim 23, further comprising means for determining a position estimate of the apparatus based on a relationship between the first sampling rate and the second sampling rate, wherein:

the first sampling rate is 1/M times a frequency of the clock signal, wherein M is a non-zero integer;

the second sampling rate is 1/N times the frequency of the clock signal, wherein N is a non-zero integer;

the first ADC is configured to sample the first positioning signal at first sample times comprising a first set of first sample times and a second set of first sample times;

the second ADC is configured to sample the second positioning signal at second sample times comprising a first set of second sample times and a second set of second sample times;

the first set of first sample times and the first set of second sample times both correspond to a first set of L cycles of the clock signal, L being a least common denominator of 1/M and 1/N;

the second set of first sample times and the second set of second sample times both correspond to a second set of L cycles of the clock signal; and an $i^{th}$ one of the first sample times of the first set of first sample times and an $i^{th}$ one of the first sample times of the second set of first sample times have substantially a same sampling time difference relative to a $j^{th}$ one of the second sample times of the first set of second sample times and a $j^{th}$ one of the second sample times of the second set of second sample times, respectively.

* * * * *